US011848663B2

(12) United States Patent
Ballandras et al.

(10) Patent No.: US 11,848,663 B2
(45) Date of Patent: Dec. 19, 2023

(54) RESONANT CAVITY SURFACE ACOUSTIC WAVE (SAW) FILTERS

(71) Applicant: FREC'N'SYS, Besançon (FR)

(72) Inventors: Sylvain Ballandras, Besançon (FR); Thierry LaRoche, Besançon (FR)

(73) Assignee: FREC'N'SYS, Besancon (FR)

(*) Notice: Subject to any disclaimer, the term of this patent is extended or adjusted under 35 U.S.C. 154(b) by 412 days.

(21) Appl. No.: 17/263,880

(22) PCT Filed: Jul. 25, 2019

(86) PCT No.: PCT/EP2019/070082
§ 371 (c)(1),
(2) Date: Jan. 27, 2021

(87) PCT Pub. No.: WO2020/021029
PCT Pub. Date: Jan. 30, 2020

(65) Prior Publication Data
US 2021/0265980 A1    Aug. 26, 2021

(30) Foreign Application Priority Data

Jul. 27, 2018   (EP) .................................... 18306023
Jul. 18, 2019   (EP) .................................... 19305956

(51) Int. Cl.
*H03H 9/64*      (2006.01)
*H03H 9/02*      (2006.01)

(52) U.S. Cl.
CPC ...... *H03H 9/6483* (2013.01); *H03H 9/02669* (2013.01); *H03H 9/02724* (2013.01);
(Continued)

(58) Field of Classification Search
CPC ............. H03H 9/6483; H03H 9/02669; H03H 9/02724; H03H 9/02771; H03H 9/02905; H03H 9/6489
See application file for complete search history.

(56) References Cited

U.S. PATENT DOCUMENTS 3,970,970 A    7/1976 Worley
4,054,851 A   10/1977 Borner et al.
(Continued)

FOREIGN PATENT DOCUMENTS

CA    3106887 A1 *  1/2020  ......... H03H 9/02669
EP    3599720 A1 *  1/2020  ......... H03H 9/02724
(Continued)

OTHER PUBLICATIONS

European Extended Search Report for European Application No. 18306023.5 dated Apr. 24, 2019, 15 pages.
(Continued)

*Primary Examiner* — Adam D Houston
(74) *Attorney, Agent, or Firm* — TraskBritt

(57) ABSTRACT

A coupled cavity filter structure that uses a surface acoustic wave, in particular, a guided surface acoustic wave, comprises an acoustic wave propagating substrate, at least one input transducer structure and one output transducer structure, provided over the substrate, each comprising interdigitated comb electrodes, at least one reflecting structure comprising at least one or more metallic strips positioned at a distance and in between the input and output transducer structures, in the direction of propagation of an acoustic wave. The acoustic wave propagating substrate is a composite substrate comprising a base substrate and a piezoelectric layer. In additional embodiments, a coupled cavity filter structure comprises a groove. In additional embodiments, a SAW ladder filter device comprises at least two coupled cavity filter structures as described herein, wherein the at least two coupled cavity filter structures are positioned on a single line.

37 Claims, 21 Drawing Sheets

(52) U.S. Cl.
CPC .... *H03H 9/02771* (2013.01); *H03H 9/02905* (2013.01); *H03H 9/6489* (2013.01)

(56) References Cited

U.S. PATENT DOCUMENTS

| | | | |
|---|---|---|---|
| 6,731,044 | B1 | 5/2004 | Mukai et al. |
| 7,304,553 | B2 | 12/2007 | Bauer et al. |
| 11,711,065 | B2 * | 7/2023 | Broekaart .......... H03H 9/02834 600/314 |
| 2009/0085430 | A1 | 4/2009 | Andle et al. |
| 2014/0144237 | A1 | 5/2014 | Tsuzuki et al. |
| 2016/0261249 | A1 | 9/2016 | Takamine |
| 2018/0205362 | A1 | 7/2018 | Kishimoto et al. |
| 2019/0238114 | A1 | 8/2019 | Kishimoto et al. |
| 2021/0305965 | A1 * | 9/2021 | Zhang .................. H03H 9/145 |
| 2022/0069804 | A1 * | 3/2022 | Roesler ............. H03H 9/02559 |
| 2022/0393666 | A1 * | 12/2022 | Plesski .................. H03H 9/568 |

FOREIGN PATENT DOCUMENTS

| | | |
|---|---|---|
| JP | 07-321598 A | 12/1995 |
| JP | 2000-286664 A | 10/2000 |
| JP | 2008-048379 A | 2/2008 |
| TW | 550882 B | 9/2003 |
| TW | 200917651 A | 4/2009 |
| TW | 201818574 A | 5/2018 |
| WO | 2005/050836 A1 | 6/2005 |
| WO | 2018/096783 A1 | 5/2018 |
| WO | 2018/097016 A1 | 5/2018 |
| WO | WO-2023047042 A1 * | 3/2023 |

OTHER PUBLICATIONS

Taiwanese Office Action for Taiwanese Application No. 108126427 dated Jun. 2, 2020.
Japanese Notice of Reasons for Refusal for Application No. 2021-503896 dated Feb. 1, 2022, 14 pages with translation.
Cross et al., Acoustically Cascaded ASW Resonator-Filters, Ultrasonics Symposium, (Jan. 1, 1976), pp. 277-280.
International Search Report for International Application No. PCT/EP2019/070082, dated Feb. 7, 2020, 7 pages.
International Written Opinion for International Application No. PCT/EP2019/070082, dated Feb. 7, 2020, 18 pages.
Schwelb et al., Modelling, simulation, and design of SAW grating filters, 1988 Ultrasonics Symposi., (Oct. 2, 1988), pp. 1-6.
Korean Office Action for Application No. 10-2021-7006224 dated Apr. 26, 2023, 7 pages.

* cited by examiner

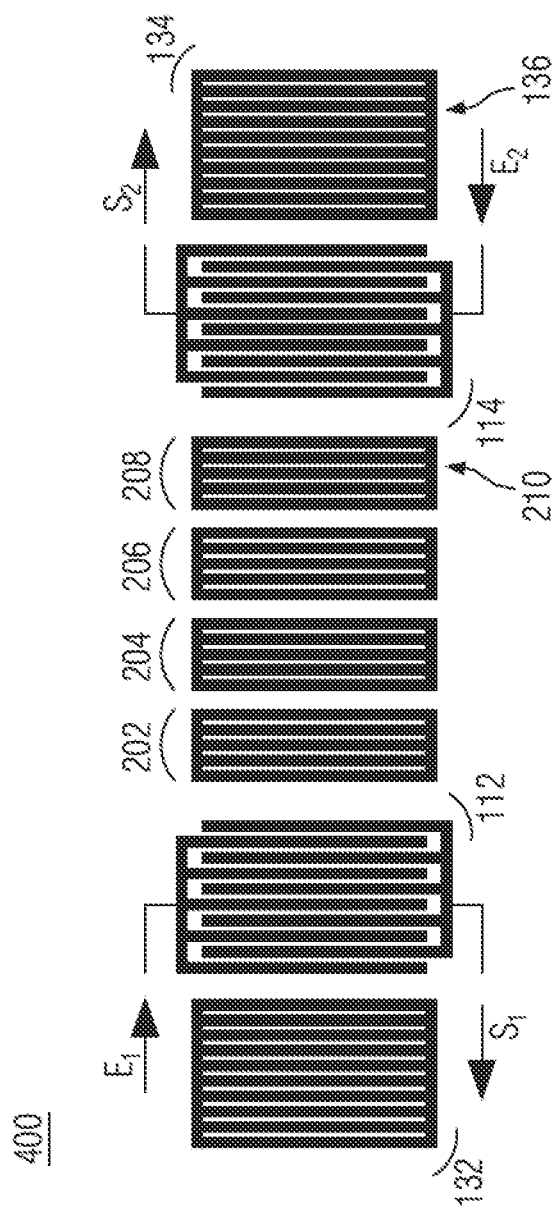

| Aperture (μm) | Metal height (μm) | Cavity number | Cavity length (μm) | Cavity mirror elec. number | Cavity mirror period (μm) | Cavity mirror a/p | IDT finger pairs | IDT period (μm) | IDT a/p | Edge mirror elec. number | Edge mirror period (μm) | Edge mirror a/p | Edge mirror gap (μm) |
|---|---|---|---|---|---|---|---|---|---|---|---|---|---|
| 3100 | 0.5 | 1 | 4.8 | 14 | 10.0 | 0.4 | 15 | 9.95 | 0.35 | 30 | 10.0 | 0.4 | 9.0 |
| 3800 | 0.7 | 2 | 4.4 | 15 | 10.0 | 0.4 | 20 | 9.96 | 0.4 | 30 | 10.0 | 0.4 | 9.0 |
| 3500 | 0.8 | 2 | 4.4 | 14 | 10.0 | 0.4 | 25-20 | 9.94 | 0.4 | 30 | 10.0 | 0.4 | 9.0 |
| 4500 | 0.8 | 2 | 4.4 | 12-13-13 | 10.0 | 0.4 | 18-17 | 9.92 | 0.4 | 30 | 10.0 | 0.4 | 9.0 |

FIG. 4

RESONANT CAVITY SURFACE ACOUSTIC WAVE (SAW) FILTERS

CROSS-REFERENCE TO RELATED APPLICATIONS

This application is a national phase entry under 35 U.S.C. § 371 of International Patent Application PCT/EP2019/070082, filed Jul. 25, 2019, designating the United States of America and published in English as International Patent Publication WO 2020/021029 A2 on Jan. 30, 2020, which claims the benefit under Article 8 of the Patent Cooperation Treaty to European Patent Application Serial No. 18306023.5, filed Jul. 27, 2018, and to European Patent Application Serial No. 19305956.5, filed Jul. 18, 2019.

TECHNICAL FIELD

This disclosure relates to surface acoustic wave devices for filter applications and, more particularly, to a composite substrate for surface acoustic wave filter devices.

BACKGROUND

In recent years, surface acoustic wave (SAW) devices have been employed in an increasing number of practical applications, such as filters, sensors and delay lines.

The synthesis of SAW filters requires different types of tools and allows for different types of structures to be implemented. However, the use of classical filter structures in SAW devices faces various problems, such as compactness and performance of the device.

SAW filter devices commonly use wafers made from a monolithic Quartz, $LiNbO_3$ or $LiTaO_3$ crystal as piezoelectric materials. However, the use of piezoelectric substrates leads to either high sensibility to temperature or weak electromechanical coupling depending on the piezoelectric material used. This results in poor performance of the filters' pass-band characteristics.

The filter performance is defined using several parameters such as bandwidth, in-band insertion loss, rejection and transition bandwidth, separating the passband and the rejection band.

Furthermore, the use of cavities for generating poles and zeros in filter transfer function is a well-known technique used systematically when developing microwave filters operating at several GHz. Such a filter requires a waveguide along which are disposed resonant elements yielding poles or zero depending the way they are connected one another (in series or in parallel). The synthesis of such filters is based on the combination of these poles and zeros providing reduced ripples in the band and an improved out-of-band rejection assuming a given coupling factor between the source and the filtering structure. In any case, the filter only consists in a series of cavities connected to one another or placed along the waveguide and accessed either by an electric connector or directly via the edges of the waveguide. For SAW devices, a conversion has to be achieved from electromagnetic to acoustic waves and vice versa to provide the electromagnetic filtered signal. In between, electrode structures are combined in a way that resonance may be combined either electrically or acoustically to produce the filtering effects.

So far, presently developed solutions for SAW filters are using three kinds of architectures to achieve the filter function, mainly impedance element lattices (the so-called SAW-ladder) or longitudinally coupled resonators filters (LCRF) or double-mode SAW (DMS) filters both based on coupling IDTs using gratings operating close to the Bragg condition. However, these approaches generally allow for two or more poles to be placed in the passband, thus resulting in non-optimized performance of the device and need a relatively large footprint.

BRIEF SUMMARY

The object of this disclosure is to overcome the drawbacks cited previously by providing a surface acoustic wave (SAW) filter device deposited on a composite substrate with improved design for compactness, simplicity and versatility as well as good performance.

The object of this disclosure is achieved by a coupled cavity filter structure, using a surface acoustic wave, in particular, a guided surface acoustic wave, comprising an acoustic wave propagating substrate, at least one input transducer structure and one output transducer structure, provided over the substrate, each comprising inter-digitated comb electrodes, at least one reflecting structure, the at least one reflecting structure comprising at least one or more metallic strips, positioned at a distance d and in between the input and output transducer structures, in the direction of propagation of an acoustic wave, wherein the acoustic wave propagation substrate is a composite substrate comprising a base substrate and a piezoelectric layer. With such a filter structure, the passband may be adjusted and at the same time filter structures with reduced footprint may be obtained compared to the above described filter structures in the art.

According to a variant of the disclosure, the coupled cavity filter structure may be configured so that the surface acoustic wave is a shear wave or a longitudinal wave inside the piezoelectric layer. Whereas in the prior art use was made of Rayleigh waves, the use of a piezoelectric layer instead of a bulk substrate opens the way to use acoustic waves of a different type, thereby providing further optimization parameters. Guided shear waves can provide the highest electromechanical coupling reachable using composite substrates. They allow for accessing higher wave velocities than elliptically polarized waves with extended opportunities for thermal compensation compared to classical Rayleigh-like waves. Furthermore, the use of given combination of substrates and excitation conditions enables one to excite longitudinally polarized guided waves, yielding higher velocity than other wave types, shear waved and Rayleigh wave, with coupling in excess of 5%.

According to a variant of the disclosure, the inter-digitated comb electrodes of the at least one input transducer structure and one output transducer structure may be defined by the Bragg condition given by $p=\lambda/2$, $\lambda$ being the operating acoustic wavelength of the transducer structures and p being the electrode pitch of the transducer structures. This approach enables the attainment of optimal dimension and excitation conditions or coupling conditions for a given frequency, bandwidth and energy confinement.

According to a variant of the disclosure, the coupled cavity filter structure can further comprise at least one Bragg mirror, located apart from the input and/or output transducer structure, on the opposite side of the side where the at least one reflecting structure is located, in the direction of propagation of the acoustic wave. The presence of the Bragg mirror located next to the transducer structure enables to reduce losses in the structure.

According to a variant of the disclosure, the coupled cavity filter structure can comprise a plurality of reflecting structures, separated from each other by a gap g and positioned at a distance d and in between with respect to the input and output transducer structures, in the direction of propagation of an acoustic wave, each gap g between the reflecting structures and each gap d between a transducer structure and its adjacent reflecting structure forming an acoustic cavity. The fact that the structure has more than one reflecting structure provides a plurality of acoustic cavities in the structure. A higher number of acoustic cavities allows narrowing the transition band.

According to a variant of the disclosure, the dimension of each acoustic cavity of the cavity filter structure may be smaller than $\lambda/4$, in particular, so that the phase velocity in the cavity is superior to the phase velocity within the reflecting structure. Such dimensions can improve the resonance conditions and thereby the performance of the filter.

According to a variant of the disclosure, the distance between neighboring reflecting structures of the plurality of reflecting structures and/or the distance between a reflecting structure and a neighboring transducer structure may be the same or different. By adapting the dimension of the gap, thus of the cavity, the filter parameters may be improved.

According to a variant of the disclosure, the reflecting structure or the reflecting structures can have a unitary metallic strip reflection coefficient superior to the coupling coefficient $k_s^2$ of the composite substrate and of the electrodes of the transducer structure, in particular, a unitary metallic strip reflection coefficient at least 1.5 times superior to the coupling coefficient $k_s^2$. A higher ratio of the reflection coefficient over the coupling coefficient provides, for a given bandwidth, an essentially flat in-band transfer function and sharpened transition bands, with a reduced in-band ripple effect compared to filters not satisfying the condition.

According to a variant of the disclosure, each reflecting structure can comprise at least one or more metallic strips with a pitch of the metallic strips being the same or being different to the electrode pitch of the transducer structure. Using highly reflecting structures can give more tolerance of the mirror to manufacturing variations but it also allows for shifting reflection function zeros to improve the out-band rejection.

According to a variant of the disclosure, the metallic strips of each reflecting structure may be electrically connected to each other. Thus, a constant value of the electrical potential throughout each reflecting structure may be obtained, thereby improving the reflection coefficient of the reflecting structure at the Bragg condition.

According to a variant of the disclosure, the number of metallic strips of each reflecting structure of the plurality of reflecting structures may be below 30, preferentially below 20, so that the reflection coefficient of the plurality of reflecting structures is above 0.5, in particular, above 0.8. Thus, the cavities confinement of the acoustic energy may be improved and mode coupling conditions may be provided in the structure.

According to a variant of the disclosure, the difference between the acoustic impedance of the material from the piezoelectric layer and the material from the metallic strips of the each reflecting structure of the plurality of reflecting structures may be such that the reflection coefficient of the plurality of reflecting structures is superior to 0.5, in particular, superior to 0.8. By increasing the reflection coefficient, it becomes possible to reduce the size of the filter structure.

The object of the disclosure is also achieved by a coupled cavity filter structure, using a surface acoustic wave, in particular, a guided surface acoustic wave, comprising an acoustic wave propagating substrate, at least one input transducer structure and one output transducer structure, provided over the substrate, each comprising electrodes, one reflecting structure, the reflecting structure comprising a groove, positioned at a distance L and in between the input and output transducer structures, in the direction of propagation of an acoustic wave, wherein the acoustic wave propagation substrate is a composite substrate comprising a base substrate and a piezoelectric layer. With such a filter structure, the passband may be adjusted and at the same time filter structures with reduced footprint may be obtained compared to the above described filter structures in the art.

According to a variant of the disclosure, the coupled cavity filter structure may be configured so that the surface acoustic wave is a shear wave or a longitudinal wave inside the piezoelectric layer. Whereas in the prior art use was made of Rayleigh waves, the use of a piezoelectric layer instead of a bulk substrate opens the way to use acoustic waves of a different type, thereby providing further optimization parameters. Guided shear waves can provide the highest electromechanical coupling reachable using composite substrates. They allow for accessing higher wave velocities than elliptically polarized waves with extended opportunities for thermal compensation compared to classical Rayleigh-like waves. Furthermore, the use of given combination of substrates and excitation conditions enables one to excite longitudinally polarized guided waves, yielding higher velocity than other wave types, shear waved and Rayleigh wave, with coupling in excess of 5%.

According to a variant of the disclosure, the coupled cavity filter structure can further comprise at least one additional groove, located apart from the input and/or output transducer structure on the opposite side of the side where the one reflecting structure is located, in the direction of propagation of the acoustic wave. The presence of the grooves located next to the transducer structure enables to reduce losses in the structure and may be configured such as to obtain a total reflection of the acoustic wave propagating in the transducer.

According to a variant, the electrodes of the at least one input transducer structure and one output transducer structure may be defined by the electrode pitch p being equal to $n\lambda$, $\lambda$ being the operating acoustic wavelength of the transducer structures.

According to a variant, the coupled cavity filter structure can further comprise at least one additional groove, located apart from the input and/or output transducer structure on the opposite side of the side where the one reflecting structure is located, in the direction of propagation of the acoustic wave.

According to a variant, the depth $D_3$ of the at least one additional groove located apart from the input and/or output transducer structure on the opposite side of the side where the one reflecting structure is located, in the direction of propagation of the acoustic wave, may be of the order of $\lambda$ or more.

According to a variant, the coupled cavity filter can comprise a plurality of reflecting structures separated from each other by a gap g and positioned at a distance L and in between the input and output transducer structures, in the direction of propagation of an acoustic wave, each gap g between the reflecting structures forming an acoustic cavity. According to a variant, the distance $L_2$ between the edge of the groove and a position A, B in the direction of propagation of an acoustic wave corresponding to the end of the pitch of the transducer structure (812, 814) on the side where the groove is located can form an acoustic cavity. The fact that the structure has more than one reflecting structure provides a plurality of acoustic cavities in the structure. A higher number of acoustic cavities allows narrowing the transition band.

According to a variant, the distance between the edge of the groove (822, 1022, 1322, 1422, 1522, 1722) and the edge of the at least one additional groove (932, 934) may be of the order of nλ. Such dimensions can improve the resonance conditions and thereby the performance of the filter.

According to a variant, the relief angle of the groove of the reflecting structure, the relief angle being the angle between the horizontal axis X and the edge walls of the groove, may be of the order of 70° or more, in particular, is of the order of 90°.

According to a variant, the depth of the groove of the reflecting structure is of the order of λ or more, in particular, is of the order of 10λ or more, λ being the wavelength of the surface acoustic wave.

According to a variant, the at least one additional groove is configured such as to obtain a total reflection of the propagating wave along the propagation direction.

According to a variant, the acoustic cavity formed between at least two grooves of the plurality of reflecting structures may be located at the surface of the substrate, being also the surface of the substrate where the transducer are located.

According to a variant, the acoustic cavity formed between at least two grooves of the plurality of reflecting structures may be located at a depth comprised between the surface of the substrate and the bottom surface of the at least two grooves located at a depth D.

According to a variant, the input and output transducer structures may be different, in particular, the number of electrodes fingers of each transducer structure may be different. Thus, the filter structure is more versatile and the structure of the transducer may be modified in order to optimize the coupling efficiency of the mode within the reflecting structures in order to obtain low insertion loss.

According to a variant of the disclosure, the acoustic cavities may be split into sub-cavities separated from one another. The sub-cavities may be separated from one another by additional layers allowing for generating evanescent coupling from one cavity to another. Thus, the sub-cavities favor energy confinement in the structure and can lead to an improvement of the compactness of the device.

According to a variant of the disclosure, the cavity filter structure comprises at least three or more transducer structures in the direction of propagation of the acoustic wave. The source density may be increased, yielding an improved rejection. Also, the filter band may be flatter than for the same filter with only two transducers.

According to a variant of the disclosure, the characteristics of the piezoelectric layer and of the electrodes of the transducer structures may be chosen such that the electromechanical coupling coefficient $k_s^2$ of the shear wave, preferentially guided or guided longitudinal wave in the piezoelectric layer is superior to 5%, in particular, superior to 7% to obtain a higher filter bandpass properties, in particular, by adapting the electrode geometry of transducer structure, e.g., the thickness, width and/or length and/or number and/or shape of the electrodes but also the thickness of the piezoelectric layer which should be larger than or equal to 5% of the wavelength λ.

According to a variant of the disclosure, the thickness of the piezoelectric layer may be chosen such that the electromechanical coupling coefficient $k_s^2$ of the shear wave, preferentially guided, or of the guided longitudinal wave, in the piezoelectric material layer (104) is superior to 5%, in particular, superior to 7%. For a larger thickness, larger than λ, the acoustic wave loses its guided property yielding multiple wave emission in the layer and energy losses in the substrate.

According to a variant of the disclosure, the cavity filter structure can further comprise a dielectric layer, in particular, a $SiO_2$ layer, sandwiched between the base substrate and the piezoelectric layer. The dielectric or passivation layer can improve the attachment of the piezoelectric layer over the base substrate but can also improve the electromechanical coupling while keeping temperature stability of the surface acoustic wave device. Preferably, the dielectric layer has a thickness of less than 1 μm, in particular, a thickness in a range of 100 nm to 1 μm.

According to a variant of the disclosure, the piezoelectric layer of the composite substrate may be Aluminum Nitride (AlN), Zinc Oxide (ZnO), PZT, Niobate Potassium $KNbO_3$ and similar materials such as KTN, etc., as well as piezoelectric relaxors such as PMN-PT and related materials, Gallium Nitride (GaN), Lithium Tantalate $LiTaO_3$ or Lithium Niobate $LiNbO_3$ with a crystallographic orientation for Lithium Tantalate $LiTaO_3$ or Lithium Niobate $LiNbO_3$ defined as (YXl)/θ according to the standard IEEE 1949 Std-176, with θ, an angle of the crystallographic orientation being comprised between 0° and 60° or between 90° and 150°.

According to a variant of the disclosure, the base substrate of the composite substrate may be one of Silicon, in particular, a high resistivity Silicon substrate comprising a trap-rich layer, Carbon-Diamond, Sapphire, or Silicon-Carbide. By high resistivity, one understands electrical resistivity of more than 1000 Ohm cm. For transferring piezoelectric layers on Silicon, mass production methods like SMART CUT®, using ion implantation in a piezoelectric source substrate to define a layer to be transferred, attaching the source substrate to a Silicon substrate and transferring the layer by a thermal or mechanical treatment may be used. Simpler approaches based on bonding a piezoelectric substrate to the base substrate with subsequent thinning (via CMP, grinding, polishing) of the piezoelectric substrate may also be used for this disclosure, in particular, suitable for thick piezoelectric layers envisaged of the order of a final thickness of 5 to 20 μm. Both approaches, layer transfer via SMART CUT® or via bonding/thinning, lead to single crystal piezoelectric layers formed on the base substrate, having thus high quality.

According to a variant of the disclosure, the base substrate can comprise a Bragg mirror, underneath the piezoelectric layer. The Bragg mirror consists of a stack of layers with periodically alternated acoustic impedance deposited or manufactured on top of a plate of any inorganic material. The stack of layers behaves like a mirror for the waves excited in the top piezoelectric layer provided the thickness of each layer is about a quarter of the acoustic wavelength. Therefore, the mirror reflects waves with components pointing toward the substrate depth, confining the waves in the piezoelectric layer.

According to a variant of the disclosure, the coupled cavity surface acoustic wave filter structure has a filter band-pass comprised between 0.5% and 10%. It is possible to vary the bandpass of the filter device by varying the parameters of the cavity filter structure and thus the device may be adapted to the specifications of a user to obtain the required filter bandpass.

According to a variant of the disclosure, the coupled cavity filter structure can further comprise a passivation layer formed over the transducer structures and the at least one reflecting structures, the passivation layer having a predetermined thickness which is same or different over the transducer structures and/or the at least one reflecting structures.

The object of the disclosure is also achieved with a SAW ladder filter device comprising at least two coupled cavity filter as described previously, wherein the at least two coupled cavity filter devices may be positioned on a single line. Since the coupled cavity filters according to the disclosure may be positioned on a single line, the positioning and connecting of the multiple cavity filters does not require so much space as in state of the art SAW ladder device. The SAW ladder filter device according to the disclosure consists in a compacter device compared to a state of the art SAW ladder filter device.

BRIEF DESCRIPTION OF THE DRAWINGS

Embodiments of the present disclosure may be understood by reference to the following description taken in conjunction with the accompanying figures, in which reference numerals identify features of embodiments of the disclosure.

FIGS. 2a to 2e illustrate a coupled cavity surface acoustic wave filter structure according to a second embodiment of the disclosure and its variants.

FIG. 4 shows a table listing the characteristics of the coupled cavity surface acoustic wave filter structure as shown in FIG. 2b, according to the disclosure.

DETAILED DESCRIPTION

FIG. 1 shows a coupled cavity surface acoustic wave filter structure according to a first embodiment of the disclosure.

Figure 1A:
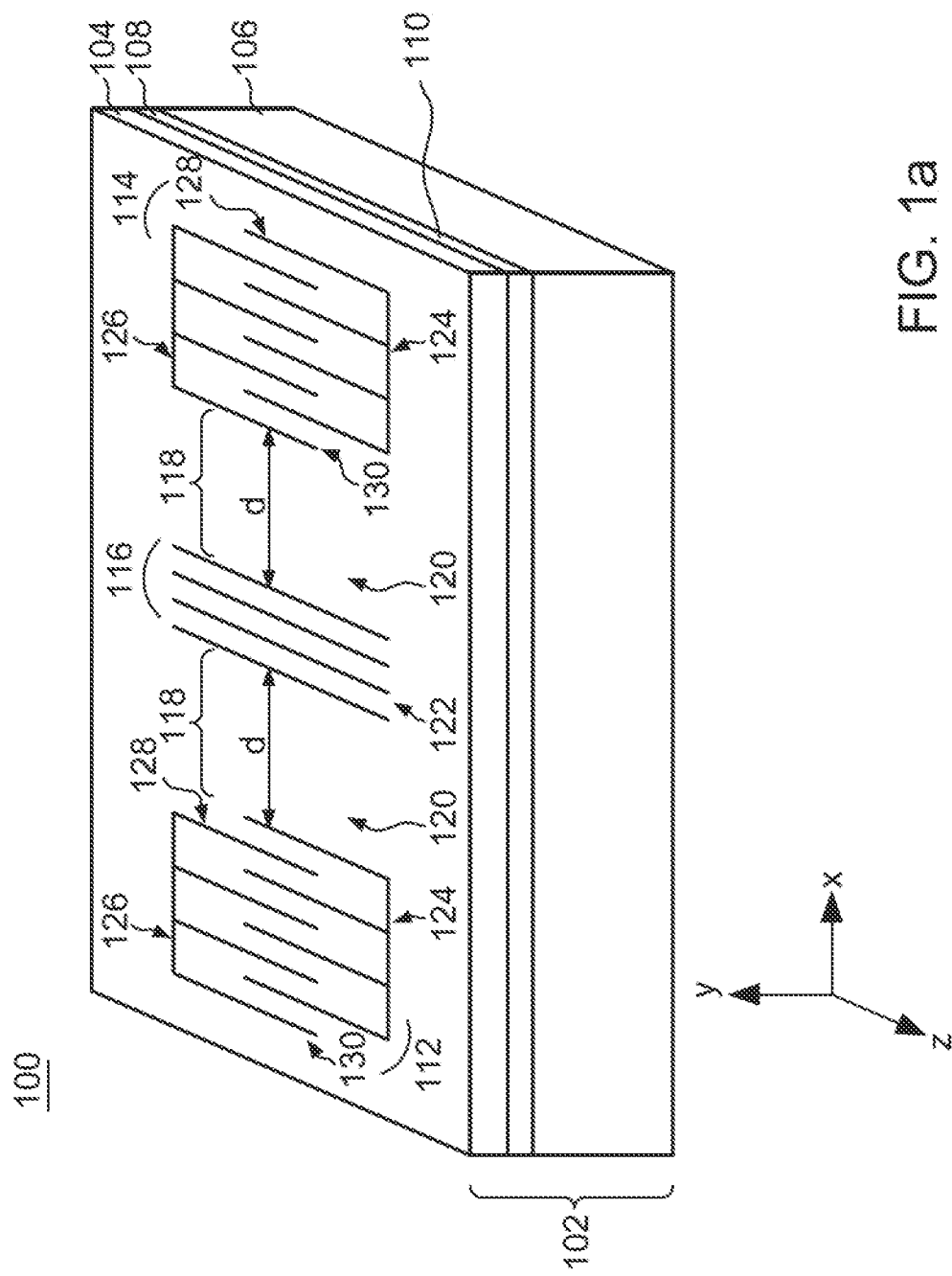
FIGS. 1a and 1b illustrate a coupled cavity surface acoustic wave filter structure according to a first embodiment of the disclosure and its variants.

In FIG. 1a, the coupled cavity surface acoustic wave filter structure 100 is realized on a substrate 102, being a composite substrate. The composite substrate 102 comprises a layer of piezoelectric material layer 104, with crystallographic axis X, Y and Z, formed over a base substrate 106.

The piezoelectric material layer 104 in this embodiment is $LiTaO_3$ or $LiNbO_3$, particularly with cut orientations defined by (YX1)/θ according to the standard IEEE 1949 Std-176, with θ, an angle of the crystallographic orientation being comprised between 0° and 60° or between 90° and 150°, Potassium Niobate $KNbO_3$ and similar material composition such as KTN, as well as other piezoelectric layers using sputtered or epitaxial films, for instance, Aluminum Nitride AlN, Zinc Oxide ZnO, PZT, GaN or any composition of AlN and GaN.

The thickness of the piezoelectric material layer 104 formed on the base substrate 106 is of the order of one wavelength λ or smaller, in particular, is of about 20 μm or less. The thickness t of the base substrate 106 is larger than the thickness of the piezoelectric material layer 104. A preferred situation corresponds to a base substrate thickness that is at least ten times larger than the thickness of the piezoelectric material layer 104, in particular, 50 to 100 times larger, which would correspond to a base substrate thickness equal to 250 μm-500 μm.

The base substrate 106 used in the first embodiment of the disclosure is a Silicon substrate, in particular, a high resistivity Silicon substrate. The orientation of the Silicon substrate is preferably (100) due to the higher acoustic wave propagation velocity compared to other crystalline orientation, such as, for example, (110), (111) or (001), which can, however, be used. Instead of Silicon, other substrate materials with an acoustic wave propagation velocity larger than the one of the piezoelectric layer may be chosen, such as Carbon-Diamond, Sapphire, or Silicon Carbide may be used.

In a variant of the disclosure, the base substrate 106 may further comprise a so called trap-rich layer close to the top layer of piezoelectric material, the trap-rich layer improving the isolation performance of the base substrate and may be formed by at least one of polycrystalline, amorphous, or porous materials such as, for instance, polycrystalline Silicon, amorphous Silicon, or porous Silicon, but the disclosure is not limited to such materials.

In a variant of the disclosure, the base substrate 106 can further comprise a Bragg mirror, underneath the piezoelectric material layer 104. The Bragg mirror consists of a stack of layers with periodically alternated acoustic impedance deposited or manufactured on top of a plate of any inorganic material. The acoustic impedance is the product of the wave velocity times the material density and is expressed in Rayleigh and preferably in Mrayleigh, i.e., $10^6$ Rayleigh. A piezoelectric layer is deposited or manufactured atop the layer stack for the excitation and detection of acoustic waves. The stack may be advantageously composed of an alternation of Tungsten and Silica, or $Si_3N_4$ and $SiO_2$, or Mo and Al, and in general any couple of material exhibiting an acoustic impedance ratio larger than two. The inorganic sub plate may be advantageously standard silicon or high resistivity silicon or glass and generally any material exhibiting a thermal coefficient of expansion (TCE) smaller than 6 ppm/K. It can also incorporate a trap-rich layer to improve electrical isolation. Advantageously, the first layer of the stack may be $SiO_2$ or in general any material that may be used to bound the piezoelectric layer to the above-described composite substrate.

In this embodiment, a thin $SiO_2$ layer 108 is provided at the interface 110 between the piezoelectric material layer 104 and the base substrate 106 to improve the attachment of the piezoelectric material layer 104 to the base substrate 106. The $SiO_2$ layer 108 is 200 nm thick, but in a variant, the thickness of the $SiO_2$ layer 108 can vary and be more or less than 200 nm thick, in particular, can vary between 10 nm and 6 μm.

The coupled cavity filter structure 100 comprises also two transducer structures 112, 114 and one reflecting structure 116, positioned between the two transducer structures 112, 114 at a certain distance d of the transducer structures 112, 114 in the direction of propagation X as shown in FIG. 1. The region located between the reflecting structure 116 and one transducer structure 112, 114, for example, the region 118 with its width defined by the distance d, corresponds to an acoustic cavity 120. In the present case, the electrodes are centered inside the pitch p of the transducers 112, 114. Thus, in the following, the end of a pitch p of the transducer structure 112, 114 is located at a distance from the electrode 128. In an example, when the ratio a/p of the transducer structure 112, 114 is 50%, the end of the pitch p is at a distance equal to $\lambda/8$ off the first electrode 128 of the transducer structure 112, 114.

As a consequence, the acoustic cavity extends between the reflecting structure 116 and the end of the pitch p of the of the transducer structure 112, 114, on the side where the reflecting structure 116 is located. Thus, in the coupled cavity surface acoustic wave filter structure 100, various acoustic cavities are present in the direction of propagation of the acoustic wave, in the coupled cavity filter structure shown in FIG. 1a, two acoustic cavities 120 are present.

The reflecting structure 116 usually comprises one or more metallic strips 122, and is defined by the pitch (not shown) of the metallic strips 122, corresponding to the distance between the metallic strips 122 within the reflecting structure 116. Like for the transducer structures 112, 114, the pitch in the reflecting structure 116 is defined by having the metallic strips centered within the pitch.

The transducer structure 112 and 114 correspond to an input transducer structure 112 and an output transducer structure 114, but their position can also be exchanged so that the input transducer structure is on the right side and the output transducer structure is on the left side of the structure, in the direction of propagation of the acoustic wave. The E sign represents the input acoustic signal while the S sign represents the output acoustic signal of the transducer structures.

Each transducer structure 112, 114 comprises two inter-digitated comb electrodes 124, 126, each comprising a plurality of electrode means 128, 130 respectively. In this embodiment, the electrode means 128, 130 have the shape of electrode fingers. The comb electrodes 124, 126 and its respective electrode fingers 128, 130 are formed of Aluminum-based material, for example, pure Aluminum or Aluminum alloy such Al doped with Cu, Si or Ti. Nevertheless, other material may be used which generates stronger reflection coefficient for smaller electrode relative thickness. In that matter, the preferred electrode materials are Copper (Cu), Molybdenum (Mo), Nickel (Ni), Platinum (Pt) or Gold (Au) with an adhesion layer such as Titanium (Ti) or Tantalum (Ta) or Chromium (Cr), Zirconium (Zr), Palladium (Pd), Iridium (Ir), Tungsten (W), etc.

The transducer structures 112, 114 are also defined by the electrode pitch p (not shown), corresponding to the edge-to-edge electrode finger distance between two neighboring electrode fingers 128, 130 from opposite comb electrodes 124 and 126. In a variant of the disclosure, the electrode pitch p is defined by the Bragg condition given by $p=\lambda/2$, $\lambda$ being the operating acoustic wavelength of the transducer structures 112, 114. By operating acoustic wavelength $\lambda$, one understands $\lambda$ being the acoustic wavelength following $\lambda=V/f$ with f the predetermined central frequency of the filter structure and V the phase velocity of the utilized mode. Such transducer structure is also called a 2-finger-per-wavelength inter-digitated transducer (IDT).

In a variant of the disclosure, the inter-digitated transducer can operate out of the Bragg conditions, for instance, using a 3- or 4-finger-per-wavelength excitation structure or 5-finger-per-two-wavelength transducers or 7- or 8-finger-per-three wavelength.

The transducer structures 112 and 114 may be symmetrical, namely they have the same number of electrode fingers 128, 130 with the same characteristics. However, in a variant of the disclosure, they can also be different; in particular, they can have a different number of electrode fingers 128, 130.

The electrode fingers 132, 134 of the comb electrodes 128, 130 all have essentially the same length l, width w as well as thickness h. According to a variant of the embodiment, the electrode fingers 132, 134 can have different length l, width w and thickness h. The dimensions are adapted to obtain a desired coupling coefficient $k_s^2$, or to take advantage of other features such as elimination of transverse modes, modulation of the IDT impedance, reduction of unwanted mode emission, etc.

In a variant of the disclosure, the transducer structures 112, 114 may be chirped, which means that the electrode pitch p in the transducer structure may be changed continuously in a linear way or in a hyperbolic way. This will enable to enlarge the operation frequency band of the transducer and may yield some robustness versus temperature.

The pitch of the metallic strips 122 of the reflecting structure 116 may be the same as the electrode pitch p of the transducer structure 112, 114. In a variant, the pitch of the metallic strips 122 of the reflecting structure 116 may be different to the electrode pitch p of the transducer structure 112, 114.

In a variant of the disclosure, the reflecting structure 116 may be chirped as well to increase the operating band of the filter and the efficiency of the resonance of the acoustic cavities 120 located in between the transducer structures 112, 114.

Figure 1B:
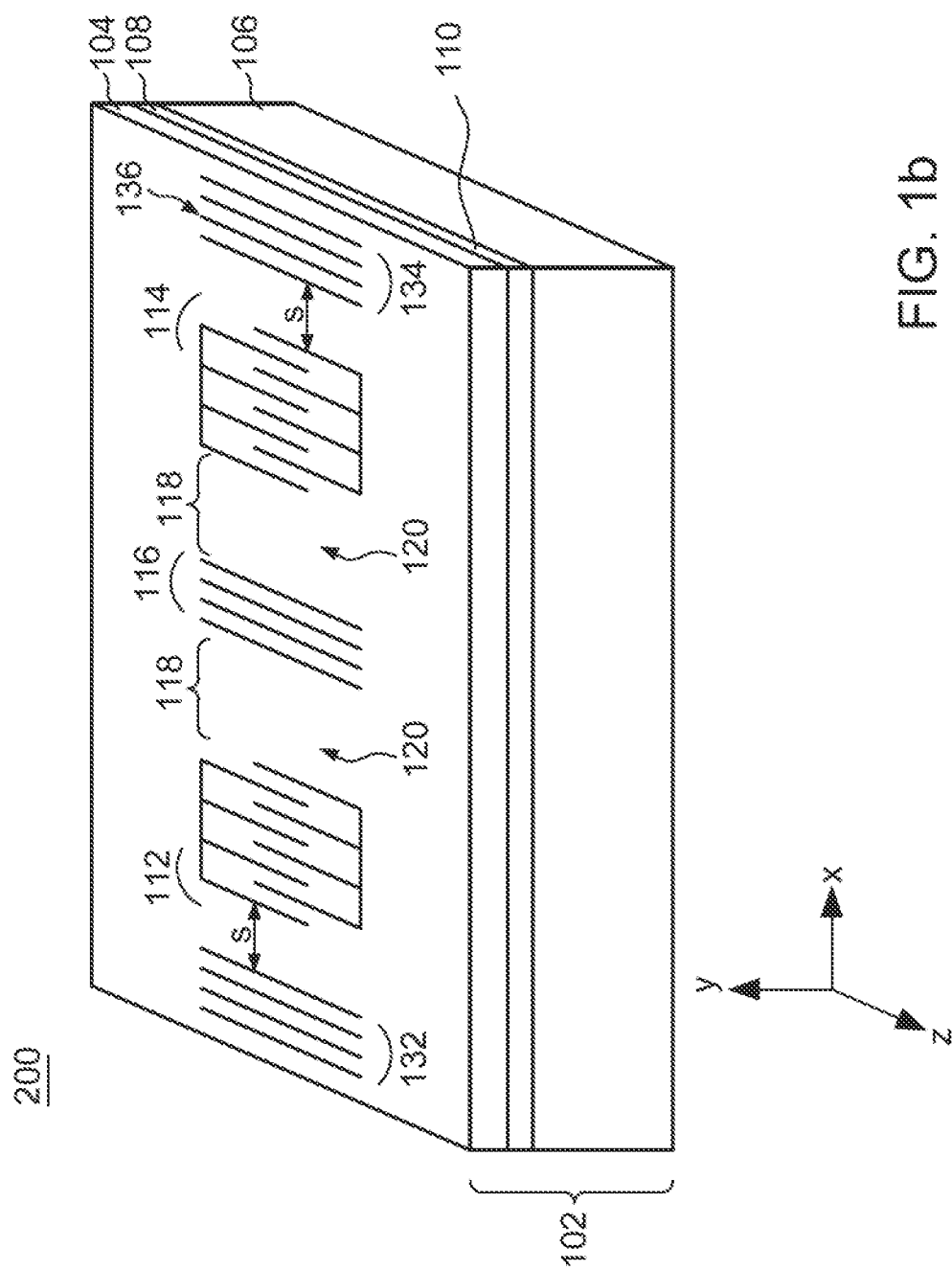

In a variant, the coupled cavity filter structure 100 further comprises two Bragg mirrors 132, 134. This variant is shown in FIG. 1b, where each Bragg mirror 132, 134 is positioned next to a transducer structure 112, 114, on the outside of the coupled cavity filter structure 200, meaning on the other side where the reflecting structure 116 is located, in the direction of propagation of the acoustic wave. Each Bragg mirror 132, 134 is positioned at a distance s of its respective transducer structure 112, 114. Each Bragg mirror 132, 134 comprises one or more metallic strips 136 and is defined by the pitch (not shown) of the metallic strips 136, corresponding to the distance between the metallic strips 136 within the Bragg mirror 132, 134.

In a variant of the disclosure, the reflecting structure 116 and the Bragg mirrors 132, 134 may be built by etching grooves instead of depositing metallic strips 136, 210. The grooves may be etched in the piezoelectric material layer 104 of the composite substrate 102 and even down to the base substrate 106.

In a variant, a passivation layer (not shown) may be formed over the transducer structures 112, 114 and the at least one reflecting structure 116. The passivation layer has a predetermined thickness which is the same or different over the transducer structures 112, 114 and/or the at least one reflecting structure 116. The passivation layer can also be formed over the Bragg mirrors 132, 134. In this variant, the substrate may be a monolithic piezoelectric wafer such as Lithium Tantalate or Lithium Niobate bulk wafers and the passivation layer could be advantageously a Silica $SiO_2$ layer or a Tantalum Pentoxide $Ta_2O_5$ layer. In this embodiment, the passivation layer has a positive thermal coefficient of expansion (TCE) whereas the substrate has a negative thermal coefficient of expansion (TCE), the layer thickness being set to reduce the temperature coefficient of frequency (TCF) of the SAW device.

FIGS. 2a to 2e show the coupled cavity filter structure according to a second embodiment of the disclosure and its variants. For all the FIGS. 2a to 2e, the coupled cavity filter structure is shown in a 2D plan view and the substrate on which it is positioned is not shown anymore. However, the substrate is the same as the substrate 102 of FIGS. 1a, 1b. The same reference numbers as in FIGS. 1a and 1b will be used to refer to the same features and will not be explained again in details.

Figure 2A:
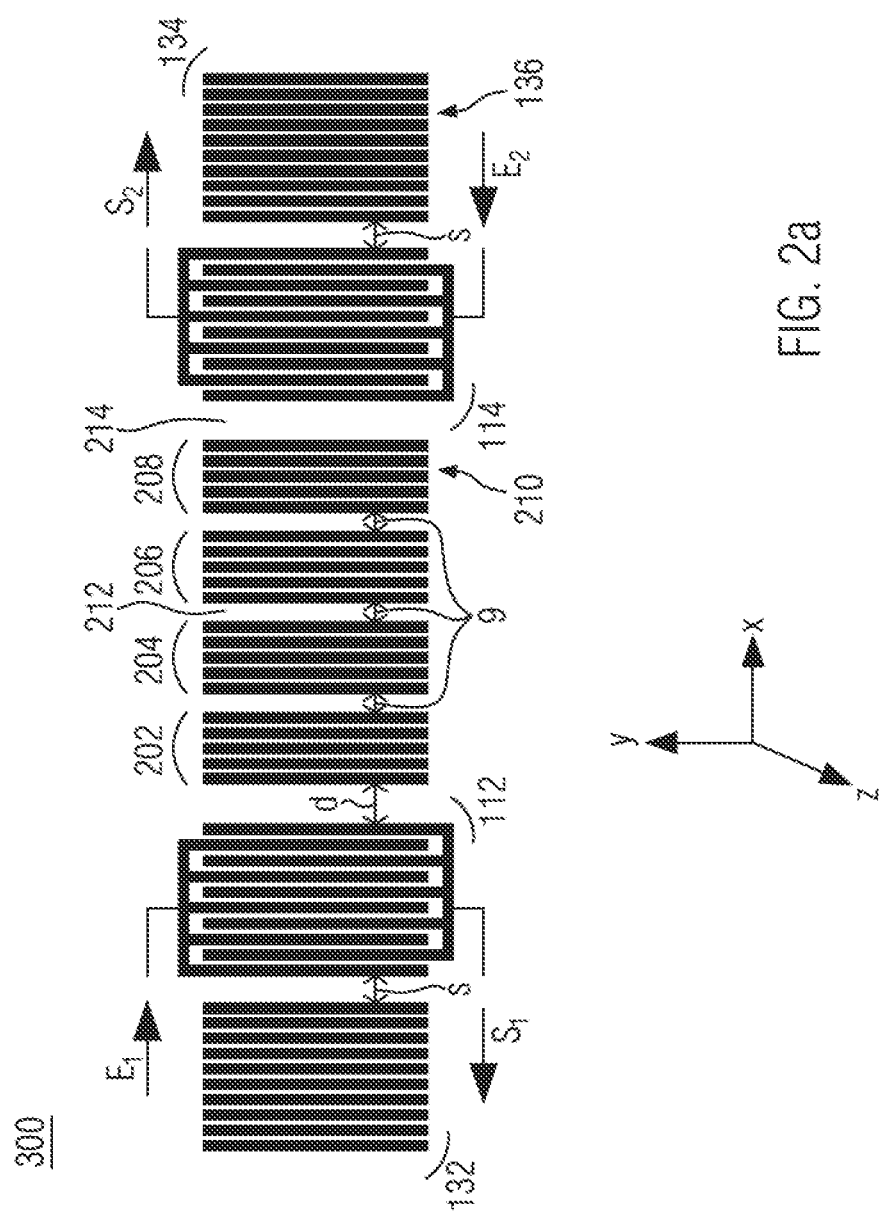

In FIG. 2a, the coupled cavity filter structure 300 comprises, like the coupled cavity filter structure 200, two transducer structures 112, 114 with two Bragg mirrors 132, 134, each positioned next to one transducer structure. The difference with the coupled cavity filter 200 is that a plurality of reflecting structures, namely four reflecting structures 202, 204, 206, 208, are present in between the transducer structures 112, 114. Each reflecting structure 202, 204, 206, 208 of the plurality of reflecting structure comprises at least one or more metallic strips 210 and are defined by the pitch (not shown) of the metallic strips 210, corresponding to the distance between the metallic strips 210 within each reflecting structure 202, 204, 206, 208. Here, the metallic strips 210 of each reflecting structure 202, 204, 206, 208, amount to four, but it may be more or less. The reflecting structures 202, 204, 206, 208, of the plurality of reflecting structures may also have the same number of metallic strips 210 but in a variant, they may each have different number of metallic strips 210. For example, the number of metallic strips 210 in the reflecting structures 202, 204, 206, 208, may increase then decrease throughout the whole reflecting structures 202, 204, 206, 208, in between the transducer structures 112, 114 to reinforce the resonance at the actual center of the structure.

These reflecting structures 202, 204, 206, 208 are separated from each other by a gap g. The region located in between two adjacent reflecting structures, for example, 202 and 204 with its width defined by the gap g, corresponds to an acoustic cavity 212. Like for the coupled cavity filter structure 100 and 200, the region located between a reflecting structure and an adjacent transducer structure corresponds also to an acoustic cavity 214, but with a width defined by the distance d between the reflective structure and the adjacent transducer structure. Like in the first embodiment, the electrodes of the transducer structures 112, 114 being centered inside the pitch p of the transducers 112, 114 and the acoustic cavity is defined as the region located between the reflecting structure 116 and the end of the pitch p of the of the transducer structure 112, 114, on the side where the reflecting structure 116 is located.

Thus, in the coupled cavity surface acoustic wave filter structure, various cavities are present in the direction of propagation of the acoustic wave, being separated by a reflecting structure, or said otherwise, a cavity is surrounded by two reflecting structures in between the transducer. Thus, in the coupled cavity filter structure 300 shown in FIG. 2a, a total of five acoustic cavities 212, 214 are present, in the direction of propagation of the mode. For a given number of reflecting structures in between the transducer structures, and with the transducer structures operating at the Bragg condition, the number of acoustic cavities equals the number of reflecting structure plus one.

In a variant of the disclosure, the reflecting structures 202, 204, 206, 208 may be chirped as well to increase the operating band of the filter and the efficiency of the resonance of the acoustic cavities 212, 214 located in between the transducer structures 112, 114.

In a variant of the disclosure, the reflecting structures 202, 204, 206, 208 and the Bragg mirrors 132, 134 may be built by etching grooves instead of depositing metallic strips 136, 210. The grooves may be etched in the piezoelectric material layer 104 of the composite substrate 102 and even down to the base substrate 106.

In a variant of the disclosure, the metallic strips 136, 210 of the reflecting structures 202, 204, 206, 208 and/or of the Bragg mirrors 132, 134 may be electrically connected to each other. The variant where the reflecting strips 136, 210 of both the reflecting structures 202, 204, 206, 208 and the Bragg mirrors 132, 134 are connected to each other is shown in FIG. 2b for the coupled cavity filter structure 400. This results in an improvement of the reflection coefficient of the reflecting structures 202, 204, 206, 208 and of the Bragg mirrors 132, 134 at the Bragg condition. All the reflecting structures 202, 204, 206, 208 and/or Bragg mirrors 132, 134 are operating in the so-called short-circuit conditions, meaning that all the metallic strips 136, 210 of a given reflecting structure 202, 204, 206, 208/Bragg mirror 132, 134 are connected to one another, yielding a constant value of the electrical potential throughout the grating structure.

Figure 2C:
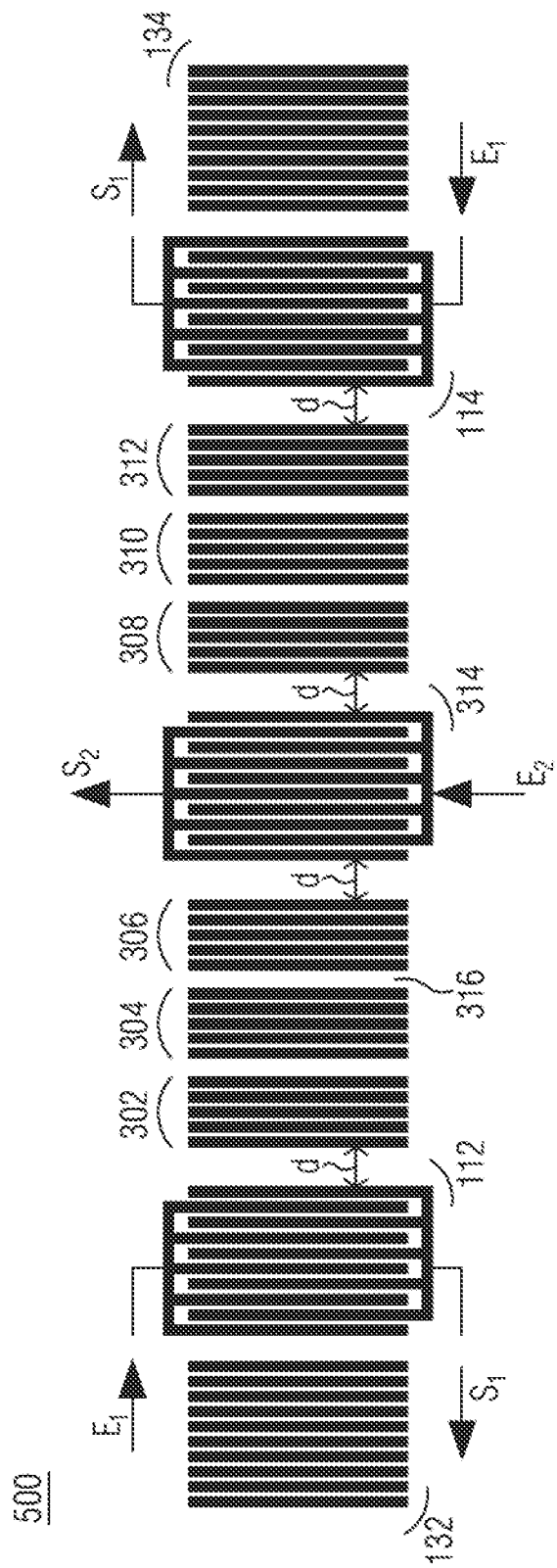

In a variant of the disclosure, the coupled cavity filter structure may comprise three transducer structures or even more. In FIG. 2c is shown the variant where three transducers structures 112, 114, and 314 are present in the coupled cavity filter structure 500. The coupled cavity filter structure 500 is also different from the coupled cavity filter structure 300 as shown in FIG. 2a as the plurality of reflecting structures comprises in total six reflecting structures 302, 304, 306, 308, 310, 312. Again, the same reference numbers will be used to describe the same features already described in FIG. 2a for the coupled cavity filter structure 300.

Two of the transducer structures 112, 114 are positioned, like in the structure of FIG. 2a, on the outside of the reflecting structures 302, 304, 306, 308, 310, 312 while the third transducer structure 314 is positioned in the middle of the reflecting structures 302, 304, 306, 308, 310, 312, so that on each side of the third transducer structure 314, three reflecting structures 302, 304, 306 and 308, 310, 312 are present. The third transducer structure 314 is also separated from the two adjacent reflecting structure by a distance d, corresponding to the same distance between the transducer structure 112, 114 and their respective neighboring reflecting structure, here 302 for the input transducer structure 112 and 312 for the output transducer structure 114. The coupled cavity filter structure 500 comprises then, in total, eight acoustic cavities 316. Such a coupled cavity filter structure 500 is symmetrical and results in a stronger confinement of energy in the acoustic cavities 316 compared to the cavity filter structure 300 as shown in FIG. 2a, with only two transducer structures 112, 114.

In a variant of the disclosure, the third transducer structure 314 is not positioned in the middle of the coupled cavity filter structure so that the coupled cavity filter structure is not symmetrical.

Figure 2D:
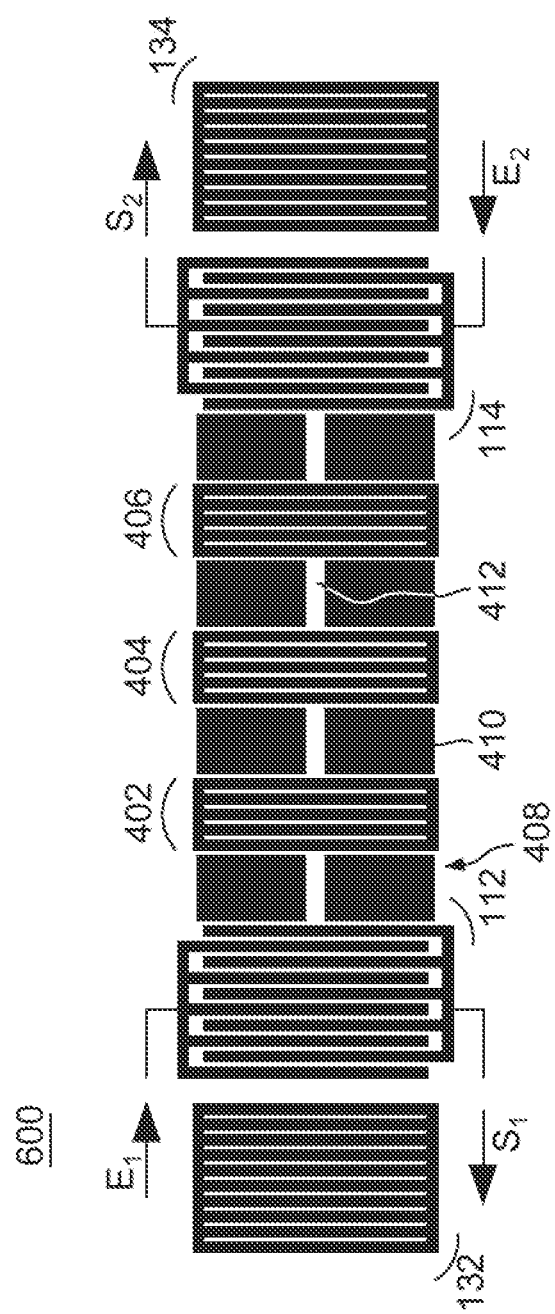

In a variant of the disclosure, the plurality of acoustic cavities may be split into sub-cavities. This variant is shown in FIG. 2d, where the sub-cavities are separated from one another by the presence of additional layers. Again, the coupled cavity filter structure 600 is also different from the coupled cavity filter structure 300 as shown in FIG. 2a as the plurality of reflecting structures comprises in total three reflecting structures 402, 404, 406. Again, the same reference numbers will be used to describe the same features already described in FIG. 2a for the coupled cavity filter structure 300. In the coupled cavity filter structure 600, the acoustic cavities 408 located in between the reflecting structures 402, 404, 406 and between a transducer structure 112, 114 and its neighboring reflecting structure 402 and 406, respectively, are split in two sections, resulting in the presence of eight dark regions 410 and four white regions 412 between the two transducer structures 112, 114. The dark regions 410 represent locations where the wave velocity is smaller than in the white regions 412, thus leading to a better energy confinement than in the coupled cavity filter structure 300 shown in FIG. 2a. Thus, the coupled cavity filter structure 600 yields additional poles, leading to an improvement of the compactness of the coupled cavity filter structure 600.

Figure 2E:
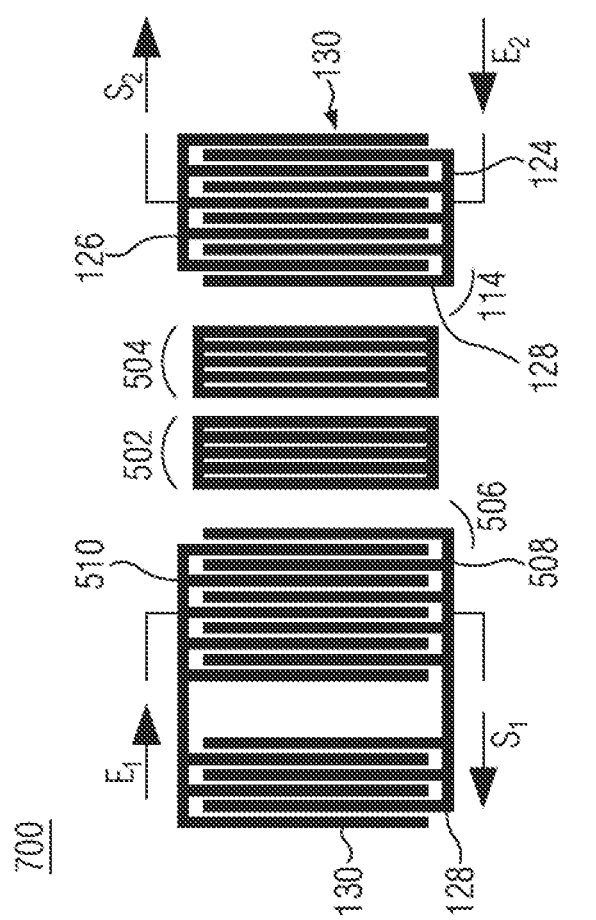

In a variant of the disclosure, the input and output transducer structures are not symmetrical or identical, and this variant is shown in FIG. 2e. Again, the coupled cavity filter structure 700 is also different from the coupled cavity filter structure 300 as shown in FIG. 2a, as the plurality of reflecting structures comprises in total two reflecting structures 502, 504. Again, the same reference numbers will be used to describe the same features already described in FIG. 2a for the coupled cavity filter structure 300. In FIG. 2c, the number of electrode fingers of each transducer structure is different. In the coupled cavity filter structure 700, the output transducer structure 114 comprises inter-digitated comb electrodes 124, 126 with each five electrode fingers 128, 130, with a constant electrode pitch p throughout the whole transducer structure 114. The transducer structure 506 comprises inter-digitated comb electrodes 508, 510, but they each have eight electrode fingers 128, 130 and furthermore a gap is present in the transducer structure 506 between the third electrode finger 128 of the inter-digitated comb electrode 508 and the fourth electrode finger 130 of the comb electrode 510. Furthermore, in this variant, no Bragg mirrors are present next to the transducer structures 114, 506, which will yield more losses and ripples than the coupled cavity filter structure 300 of FIG. 2a. However, this coupled cavity filter structure 700 offers a more compact and simpler design than the structure shown in FIG. 2a.

The coupled cavity surface acoustic wave filter structure functions in the following way. An input inter-digitated transducer (IDT) emits acoustic energy toward the reflecting structure and excites its resonance. The reflecting structure is coupled to another one, which, therefore, generates coupling conditions yielding energy transfer from one reflecting structure to another. A plurality of such reflecting structures may be coupled to one another but there is at least one output transducer structure which collects the transmitted energy.

Thus, the disclosure proposes to use a coupled cavity filter structure which takes advantage of the wave guidance of the top piezoelectric layer from the composite substrate and uses acoustic resonant cavities that couple energy from one reflecting structure to another.

In case of a coupled cavity filter structure, the resonance of the transducer structure is occurring in the low frequency transition band of the filter and the anti-resonance almost in the middle of the filter band. Therefore, conditions on the electromechanical coupling coefficient are similar to those required for impedance filters, namely that the coupling coefficient must be 1.5 to twice larger than the band to be achieved, as a given mode must exhibit a coupling factor in proportion of the bandpass to be achieved, allowing for reducing the insertion loss within this band. However, large reflection coefficients larger than the coupling coefficient, ideally 1.5 times or more the coupling coefficient are required to achieve the filter band.

According to the disclosure, the relation of the reflection coefficient with respect to the coupling coefficient may be achieved with the composite substrate, even when the coupling coefficient of the transducer structure is 5% or more. This is particularly true, when using shear waves or longitudinally waved guided in the piezoelectric layer of the composite substrate.

Due to the thickness of the piezoelectric layer, being lower than the wavelength, a shear wave mode or a longitudinal mode is guided within the piezoelectric layer. Furthermore, the energy loss in the composite substrate may be reduced. The thickness of the piezoelectric layer should be larger than or equal to 5% of the wavelength $\lambda$. For thick piezoelectric layers the shear mode of a composite substrate is not entirely guided anymore but has a lossy bulk component that reflects at the interface to the base substrate and leads to parasitic modes or rattle effect. For thin piezoelectric layers, i.e., wavelength or subwavelength thick the shear mode is, however, entirely guided with no lossy bulk mode.

The figure of merit of a filter device is the transmission of the filter, which shows the filter bandpass as a function of the frequency with the level of losses in dB in the bandpass. The filter bandpass depends on various factors, namely the coupling coefficient, the number of cavities and the coefficient of reflection.

Depending on the dimensions of piezoelectric layer, of the transducer structures, of the length of the reflecting structures, the number of coupled reflecting structures and the coupling coefficient of the mode, it is possible to synthesize a multiple pole and zero filter with extremely low insertion losses, i.e., better than 2 dB, in particular, less than 1 dB, with a 15 to 20 dB rejection or even more according to the design and the selectivity of the transducer structures.

Concerning the dimension of the acoustic cavities, the acoustic cavities should ideally be a quarter wavelength long or an odd number of quarter wavelength to meet the optimal resonance conditions according to the state of the art. In the present disclosure, the acoustic cavities length may be inferior to a quarter wavelength. This is due to the strong velocity change from free surface to grating area, yielding an acoustic impedance mismatch much large than what accessible using standard true SAW solutions.

Concerning the coupling coefficient, for a composite substrate and for the metallic strips parameters (material, dimensions), the coupling coefficient is directly related to the bandpass value by a factor 0.7, so that the required bandpass of the filter device may be obtained by choosing the materials and the dimensions of the cavity filter structure.

Concerning the number of metallic strips in the reflecting structures, it is chosen to generate a global reflection coefficient larger than 0.5, in particular, larger than 0.8, to allow confinement of the acoustic energy in the cavity and, therefore, to provide mode coupling conditions.

As already mentioned, the magnitude of the reflection coefficient preferably is larger than the coupling coefficient, ideally 1.5 times higher or more than the coupling coefficient parameter. The larger the reflection coefficient, the smaller the number of metallic strips and, therefore, the larger the filter bandwidth will be. For instance, a reflection coefficient larger than 15% allows for reducing the number of metallic strips composing the reflecting structures, which directly impacts the bandwidth of the filter: the smaller the number of metallic strips in the reflecting structures, the larger the bandwidth, provided the reflection coefficient of the structure is large or equal 50%. Considering a reflection coefficient larger than 15%, a filter with bandwidth larger than 5% may be achieved.

A particular example of a filter device operating at 2.6 GHz with a bandwidth in excess of 7% and in-band ripples smaller than 0.6 dB is given with a 30 nm thick Tantalum (Ta) electrodes on a composite substrate comprising a 300 nm thick (YXl)/52° $LiNbO_3$ layer on a 1 μm thick $SiO_2$ layer onto (100) Silicon substrate. In this example, the reflection coefficient reaches 20% and the coupling factor about 18%.

FIGS. 3a-3d show the characteristics of a surface acoustic wave filter device comprising a cavity filter structure as shown in FIG. 2b, with a composite substrate according to the disclosure, with a $SiO_2$ layer of 500 nm in between a $LiTaO_3$ (Yxl)/42° piezoelectric layer of 6 μm and a semi-infinite (100) Silicon substrate. This configuration is suitable to operate in the frequency range 50 to 250 MHz.

On such composite substrate, a pure shear true mode may be excited and propagates.

For this SAW filter device, the coupled cavity filter structure shown in FIG. 2b was used, namely an input and an output transducer structures with each an adjacent Bragg mirror, four reflecting structures leading to five acoustic cavities present in between the transducer structures. The metallic strips of both each reflecting structures and the Bragg mirrors are connected to each other for a short-circuit operation.

The inter-digitated transducer structure have an electrode pitch set to 9.95 μm and a ratio a/p set to 0.3, with a number of electrode finger pair set to 15. Furthermore, the mirror grating period is set to 10 μm and a/p to 0.4, with 30 electrodes. The gap between the mirror grating and the inter-digitated transducer structure is set to 9 μm, corresponding to about half a wavelength. Two internal reflecting structures of 14 electrodes each are separated by a gap g of 4.8 μm, corresponding to about a quarter wavelength. The aperture is then 3.1 mm.

Figure 3A:
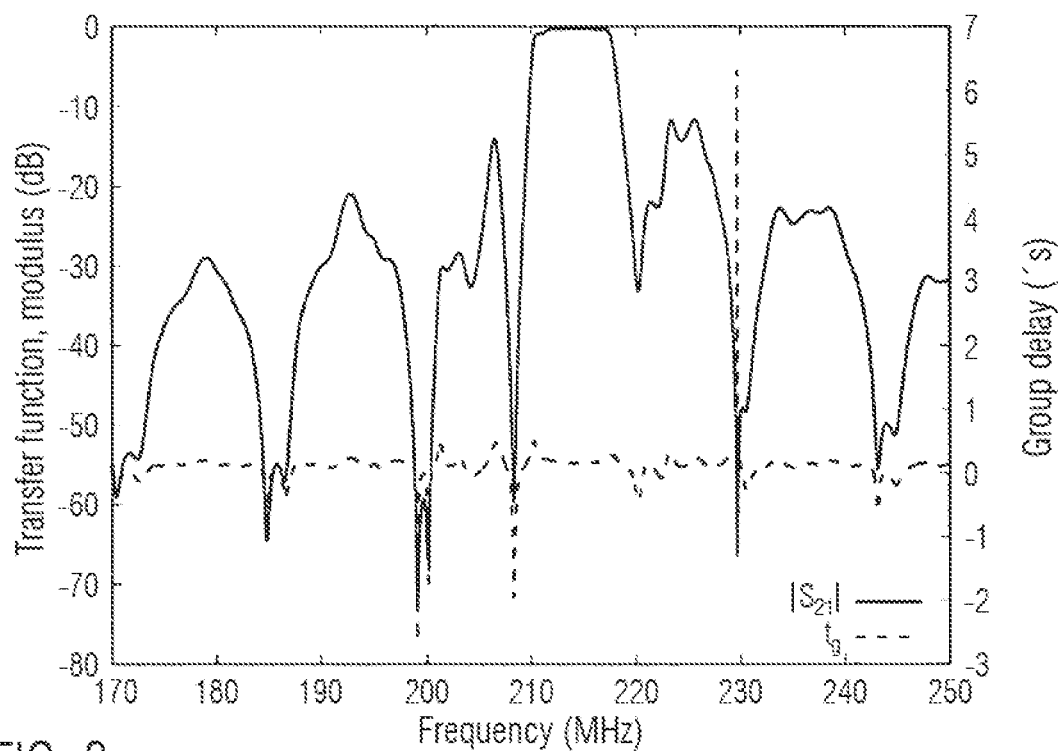
FIGS. 3a to 3d show the performance of a coupled cavity surface acoustic wave filter structure as shown in FIG. 2b, with a composite substrate according to the disclosure, with a $SiO_2$ layer of 500 nm in between a $LiTaO_3$ (YX1)/42° piezoelectric layer of 6 μm and a semi-infinite (100) Silicon substrate.
Figure 3B:
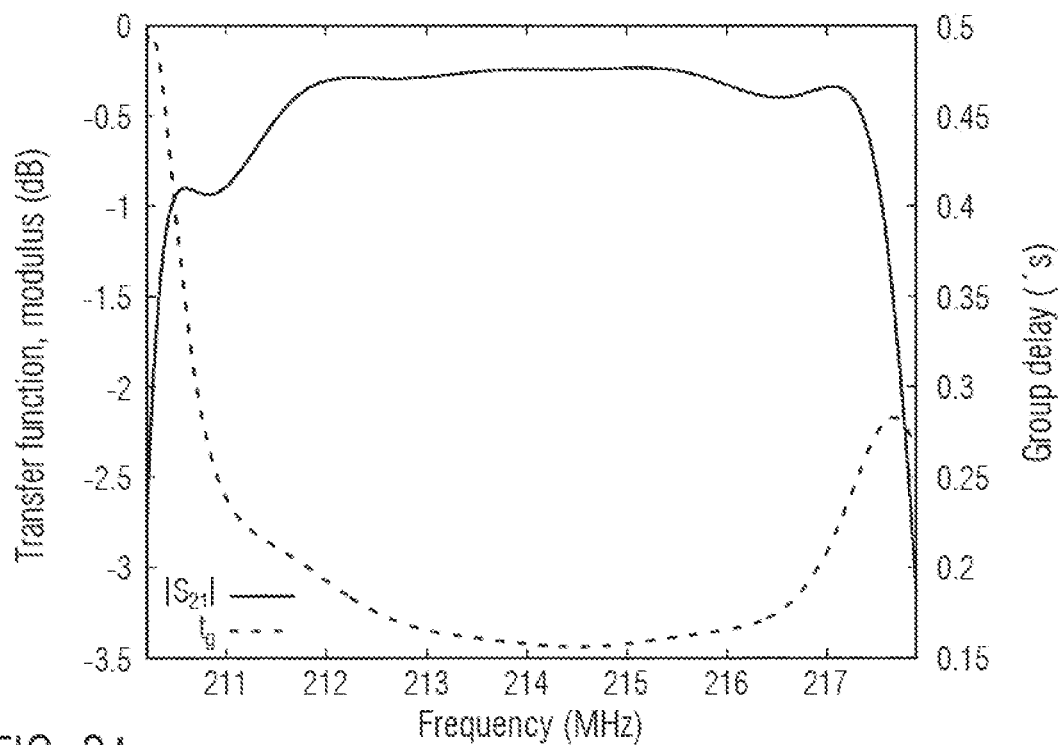
Figure 3C:
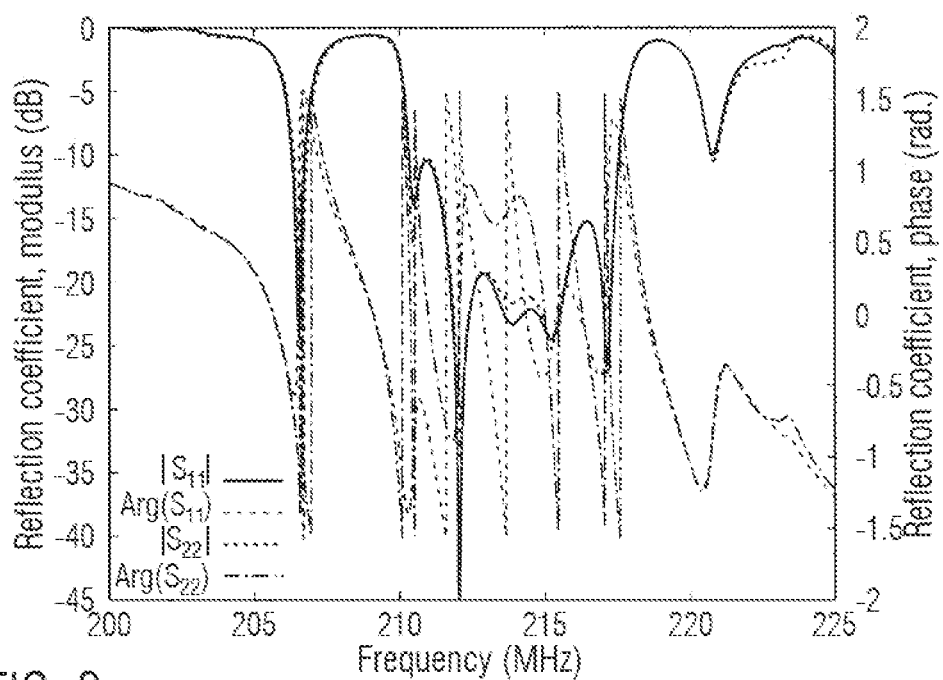
Figure 3D:
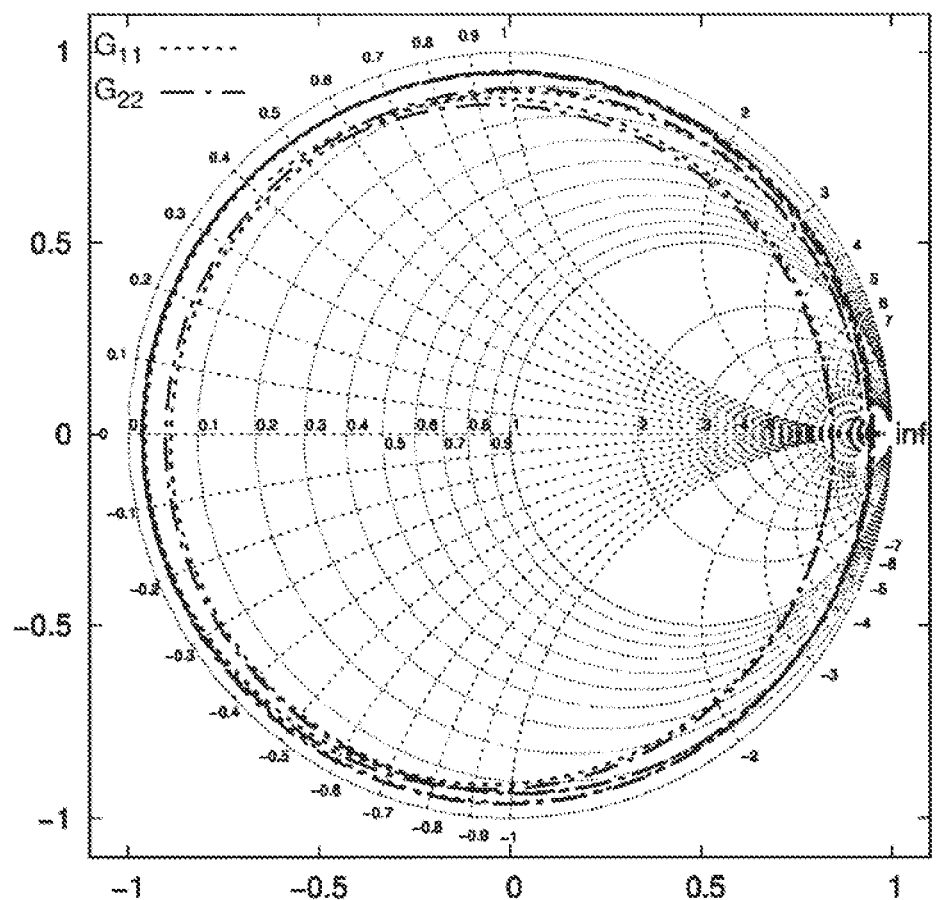

FIG. 3a shows a general view of the filter transfer function and the group delay of the filter as a function of frequency (MHz), from 170 to 250 MHz. The group delay is a measure of the phase linearity. FIG. 3b shows a zoom of FIG. 3a near the central frequency and thus focuses on the bandpass, showing the very low losses of the transfer. FIG. 3c is the reflection coefficient, showing the signature of the pole of the filter (minimum $|S_{11}|$ peaks), in function of the frequency (MHz) as well. FIG. 3d is a Smith abacus plot of the so-called reflection coefficient currently used by the skilled person in the art to assess electrical impedance matching of both ports of the filter. The reflection coefficient must be centered around the 50 Ohm condition, i.e., the center of the abacus to be matched.

The transfer function in FIG. 3a indicates the performance of the device, with a filter bandpass between 210 and 218 MHz. In FIG. 3b, it may be seen that the filter bandpass shows a flat profile at around 0.5 dB, with low in-band ripples.

FIG. 4 shows a table listing the characteristics of the coupled cavity surface acoustic wave filter structure as shown in FIG. 2b, according to the disclosure. For all the coupled cavity filter structures, the composite substrate used was the same as for FIG. 3, namely a $LiTaO_3$ (Yxl)/42° piezoelectric layer of 6 μm, with a $SiO_2$ layer of 500 nm in between the piezoelectric layer and the semi-infinite (100) Silicon base substrate.

The coupled cavity filter structure corresponds to FIG. 2b, namely an input and an output transducer structures with each an adjacent Bragg mirror, four reflecting structures leading to five acoustic cavities present in between the transducer structures. The metallic strips of both each reflecting structures and the Bragg mirrors are connected to each other for a short-circuit operation.

All the coupled cavity filter structures described in FIG. 4 correspond to the propagation of a pure shear wave mode and show performance, i.e., a filter band-pass varying from 0.5% to 10%, low insertion loss of below 2 dB, with a 15 dB to 20 dB rejection loss, a coupling factor above 5% and temperature coefficient of frequency (TCF) below 20 ppm/ K. Bandpass as large as 10% may be achieved using LNO thin layers with, for instance, Pt or W or Ta or Mo based electrodes with thickness compatible with current deposition technologies, namely with h/λ equal of less than 5%, with h the absolute thickness of the metal strip.

For a required performance of the coupled cavity SAW filter device, it is thus possible to choose the materials in order to adjust the coupling coefficient and to adjust the number and size of the reflecting structures so as not to go over a size limit of the coupled cavity filter structure.

A coupled cavity SAW filter device according to the disclosure uses a shear wave of a composite substrate in order to obtain a narrow filter band-pass comprised between 0.5% and 10%, low insertion loss of below 2 dB, with a 15 dB to 20 dB rejection loss as well as low ripples within the filter band-pass, with a reduced size due to an improved compactness.

Figure 5A:
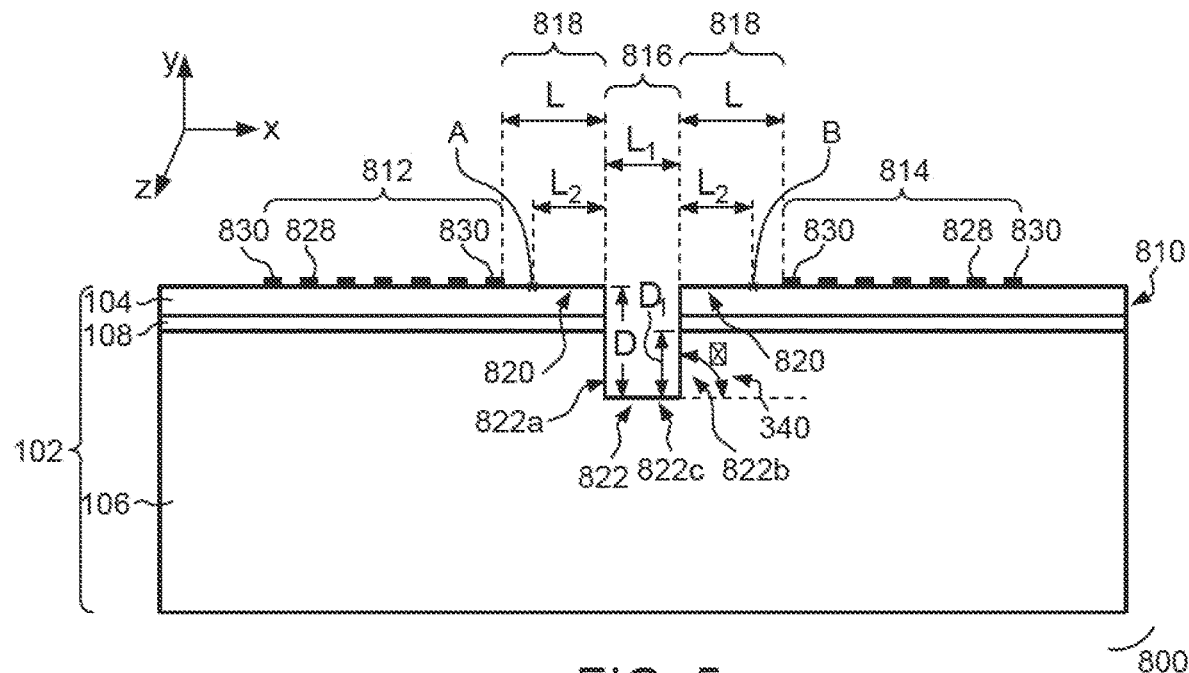
FIGS. 5a and 5b illustrate a coupled cavity surface acoustic wave filter structure according to a third embodiment of the disclosure.
Figure 5B:
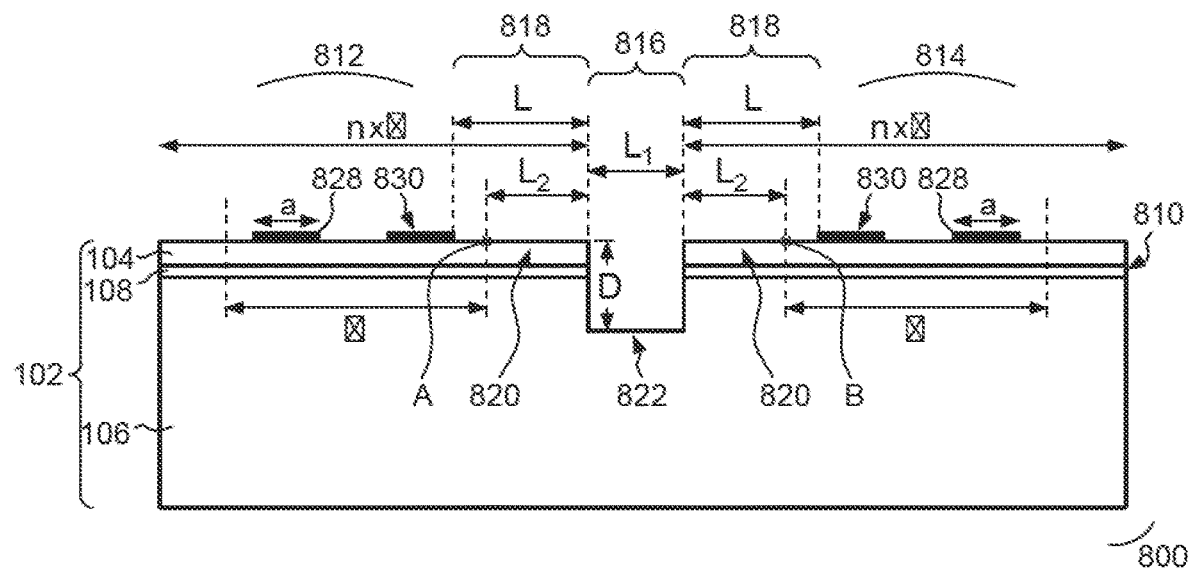

FIGS. 5a and 5b illustrate a coupled cavity surface acoustic wave filter structure according to a third embodiment of the disclosure.

In the third embodiment, like for the first embodiment shown in FIGS. 1a and 1b, the coupled cavity surface acoustic wave filter structure 800 is realized on a composite substrate 102 being the same as the substrate 102 of FIGS. 1a and 1b.

The same reference numbers as in FIGS. 1a and 1b will be used to refer to the same features and will not be explained again in details.

In this embodiment, the thin $SiO_2$ layer 108 provided at the interface 110 between the piezoelectric material layer 104 and the base substrate 106 to improve the attachment of the piezoelectric material layer 104 to the base substrate 106 is 500 nm thick.

The coupled cavity filter structure 800 comprises two transducer structures 812, 814 and one reflecting structure 816, positioned between the two transducer structures 812, 814 at a certain distance L of the transducer structures 812, 814 in the direction of propagation X as shown in FIG. 5a.

Each transducer structure 812, 814 comprises two electrodes 824, 826 (not shown), each comprising a plurality of electrode means 828, 830, respectively. The comb electrodes are connected to a +V/−V potential in an alternative manner, the electrode 824 at a +V and the electrode 826 at −V, or vice-versa. In a variant, the electrodes 824, 826 may be comb electrodes, in particular, inter-digitated electrodes.

The transducer structures 812, 814 are defined by the electrode pitch p (not shown), corresponding to the edge-to-edge electrode finger distance between two neighboring electrode fingers 828, 830 from opposite comb electrodes 824 and 826.

In this embodiment, the electrode pitch p of the transducer structures 812, 814 is defined by a number of wavelength nΔ, λ being the operating acoustic wavelength of the transducer structures 812, 814.

A metallic ratio a/p of the transducer structure is defined as the ratio of the width of the electrode a over p the pitch of the electrode.

In this embodiment of the disclosure, the reflecting structure 816 is realized by a groove 822, and is defined by the dimension $L_1$ corresponding to the distance between the two side edge walls 822a and 822b of the groove 822 and by its total depth D. The total depth D of the groove 822 is defined between the surface of the piezoelectric material layer 104 where the transducer structures 812, 814 are positioned to the bottom surface 822c of the groove 822. The depth D of the groove 822 is of the order of λ or more, in particular, is of the order of 10λ or more, λ being the wavelength of the surface acoustic wave.

Furthermore, the groove 822 is also defined by the etching relief angle θ 340, defining the position of the edge walls 822a, 822b of the groove in regard to the horizontal axis X and the bottom surface 822c of the groove 822. The relief angle θ 340 may be of the order of 70° or more, in particular, is of the order of 90°. FIG. 5a illustrates a groove 822 with a vertical edge wall corresponding to a relief angle θ 340 of 90°.

The region located between the reflecting structure 816 and a transducer structure 812, 814, for example, the region 818 with its width defined by the distance $L_2$, corresponds to an acoustic cavity 820. The distance $L_2$ is defined as the distance between one edge wall 822a, 822b of the groove 822 and a point A, B situated on the surface of the piezoelectric layer where the transducers 812, 814 are located. The point A, B is located at the end of the pitch of the of the transducer structure 812, 814, on the side where the groove 822 is located, as shown in FIG. 5a. As the electrodes are centered within the pitch, the end of the pitch of the transducer structure 812, 814 does not correspond to the end of the first electrode 830 of the transducer structure 812, 814. For example, when the ratio a/p is 50%, the end of the pitch is located at a distance equal to λ/8 of the first electrode 830 of the transducer structure 812, 814. FIG. 5b corresponds to FIG. 5a with the transducer structures 812, 814 comprising only two electrodes 828 and 830 in order to show more clearly the regions 818 of the acoustic cavities 820.

In the coupled cavity surface acoustic wave filter structure 800, two acoustic cavities 820 are present in the direction of propagation of the acoustic wave, in the coupled cavity filter structure shown in FIGS. 5a and 5b.

In this embodiment of the disclosure, the reflecting structure 816 is realized by providing, e.g., by etching, a groove 822 instead of depositing metallic strips like in the first and second embodiments.

The groove 822 is provided in the piezoelectric material layer 104 of the composite substrate 102 and in the $SiO_2$ layer down into the base substrate 106 to a total depth D. $D_1$ corresponds to the part of the depth D that is realized in the base substrate 106 only.

In a variant, the groove 822 may be etched only through the piezoelectric material layer 104 and through the $SiO_2$ layer 108 down to the surface of the base substrate 106 being the interface 810 between the $SiO_2$ layer 108 and the base substrate 106. Thus, $D_1$ would be equal to 0.

Figure 6:
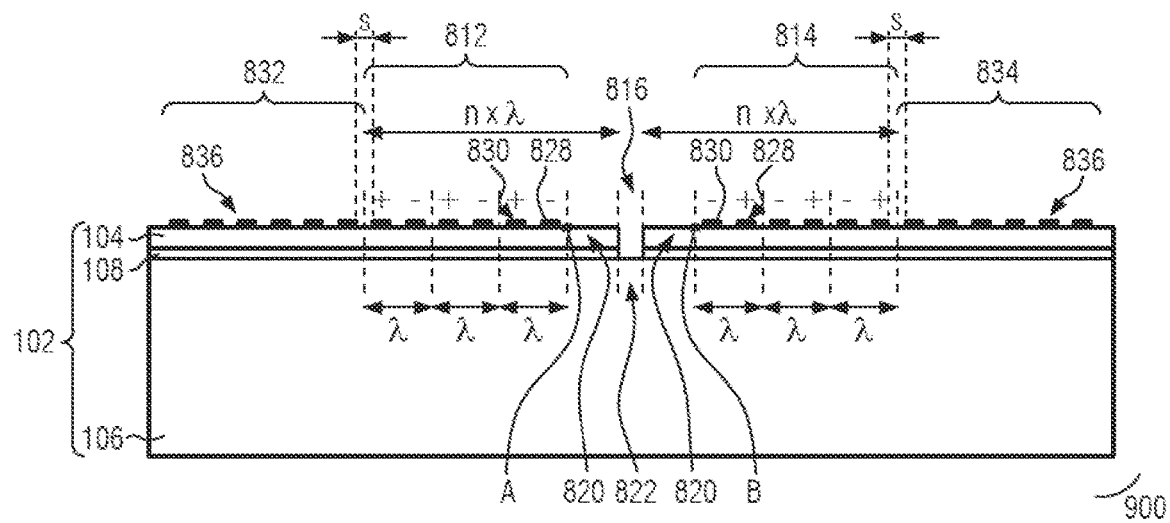
FIG. 6 illustrates a coupled cavity surface acoustic wave filter structure according to a fourth embodiment of the disclosure.

In a fourth embodiment, based on the third embodiment, the coupled cavity filter structure 900 further comprises two Bragg mirrors 832, 834. This embodiment is shown in FIG. 6, where each Bragg mirror 832, 834 is positioned next to a transducer structure 812, 814 on the other side where the reflecting structure 816 is located, in the direction of propagation X of the acoustic wave.

Each Bragg mirror 832, 834 is positioned at a distances of its respective transducer structure 812, 814. Each Bragg mirror 832, 834 comprises one or more metallic strips 836 and is defined by the pitch of the metallic strips 836, corresponding to the distance between the metallic strips 836 within the Bragg mirror 832, 834. Like for the transducer, the pitch in the Bragg mirror 832, 834 is defined by having the metallic strips 836 centered within the pitch.

In this variant, the pitch of the Bragg mirror 832, 834 is also equal to a multiple n of wavelength λ, so nλ.

In this case, on the side where the Bragg mirror 832, 834 is located, the wave will be reflected with a phase change, while on the side of the groove, the type of reflection will depend on the width and depth of the groove.

Figure 7:
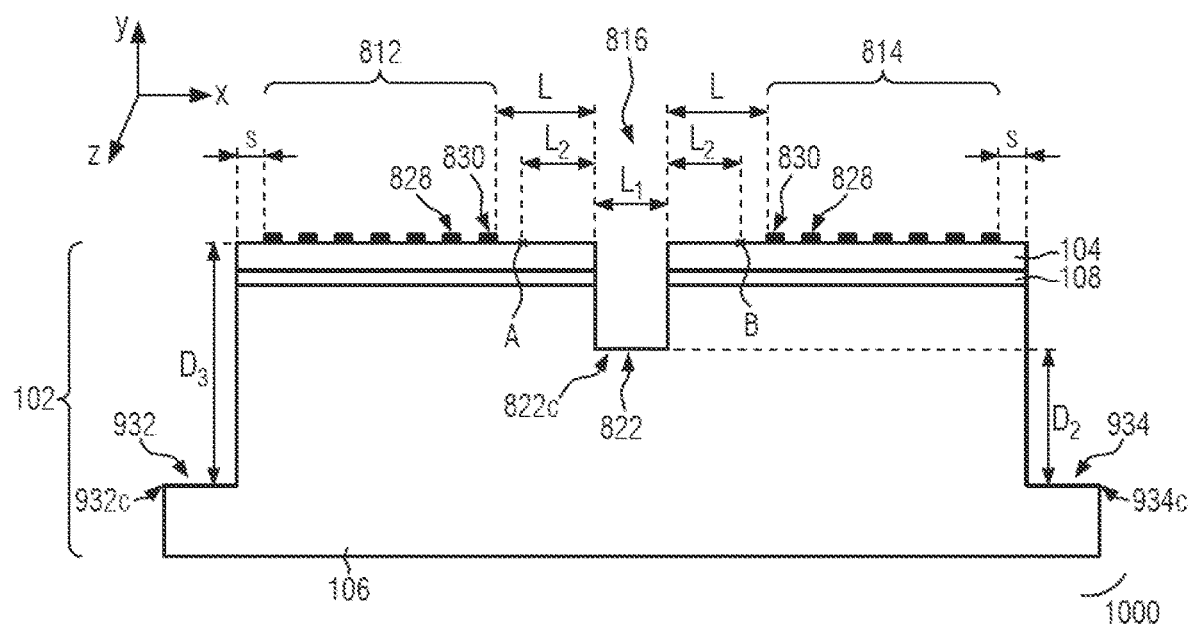
FIG. 7 illustrates a coupled cavity surface acoustic wave filter structure according to a fifth embodiment of the disclosure.

In a fifth embodiment, based on the third embodiment, the coupled cavity filter structure 1000 comprises two additional grooves 932, 934, each additional groove 932, 934 being positioned next to a transducer structure 812, 814 on the other side where the reflecting structure 816 is located, in the direction of propagation of the acoustic wave. This embodiment is shown in FIG. 7.

Each additional groove 932, 934 is positioned at a distances of its respective transducer structure 812, 814. Each additional groove 932, 934 is defined by its width $L_3$ and its total depth $D_3$. The total depth $D_3$ of the additional groove 932, 934 is defined between the surface of the piezoelectric material layer 104 where the transducers 812, 814 are positioned to the bottom surface 932c, 934c of the additional groove 932, 934. A depth $D_2$ is defined as the depth of the additional groove 932, 934 from the bottom surface 822c of the groove 822 to the bottom surface 932c, 934c of the groove 932, 934. Thus, the total depth $D_3$ is defined as D plus $D_2$, D being the total depth of the groove 822 of the reflecting structure 816. The depth $D_3$ of the at least one additional groove (932, 934) is of the order of λ or more.

In this embodiment of the disclosure, the reflecting structure 816 and the additional grooves 932, 934 are realized by providing, e.g., by etching, grooves instead of depositing metallic strips like in the first and second embodiments.

Each additional groove 932, 934 is configured to have a total reflection of the propagating wave along the propagation direction.

In a variant, the coupled cavity filter structure may comprise a Bragg mirror and a groove each positioned next to a transducer structure 812, 814 on the other side where the reflecting structure 816 is located, in the direction of propagation X of the acoustic wave on one side of the input transducer and a groove on the side of the output transducer.

The coupled cavity filter device according to one of the third to fifth embodiment operates like the coupled cavity filter device according to the first embodiment, but its structural features, i.e., the pitch of the transducers and the mirrors, the dimensions of the cavities are adapted, so that the conditions are met for the device to show similar functionality to the first embodiment.

This is because, in the case of a reflection on an edge, the definition of the reflection location is geometrically defined.

Therefore, whatever the origin of the phase within the transducer, the phase construction will occur only for an integer number of wavelengths. A Bragg mirror equivalent reflection center is more difficult to define as it exhibits a phase variation which mainly depends on the reflection strength. The reflection function of the Bragg mirror is defined as the ratio of the reflected versus incident waves defined at one edge of the mirror. It is known in the art that the magnitude of the reflection coefficient on a single electrode of the grating is conditioning the width of the spectral band corresponding to the reflection operation of the grating. However, as the phase variation of the reflection function between the beginning and the end of the mirror stop-band is always in the range pi–2×pi, it appears that the magnitude of the reflection coefficient also impacts the phase variation of the reflection coefficient vs frequency.

Thus, replacing the reflecting structure comprising metallic strips of the first and second embodiment by the reflecting structure comprising a groove as in the third, fourth, fifth and sixth embodiment results in the condition of having a multiple of A for the coupled cavity filter device to function.

All the variants of the coupled cavity filter device according to the first and second embodiments may also be applied to the coupled cavity filter device according to the third, fourth, fifth and sixth embodiment.

FIGS. 8a to 8h illustrate a coupled cavity surface acoustic wave filter structure according to a sixth embodiment of the disclosure and its variants.

Figure 8A:
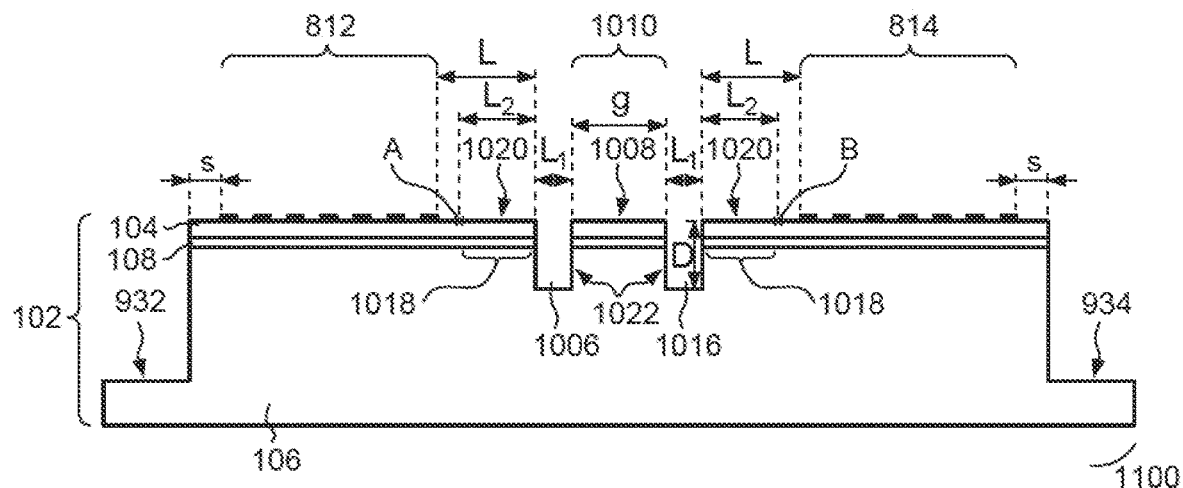
FIGS. 8a to 8h illustrate a coupled cavity surface acoustic wave filter structure according to a sixth embodiment of the disclosure and its variants.
Figure 8B:
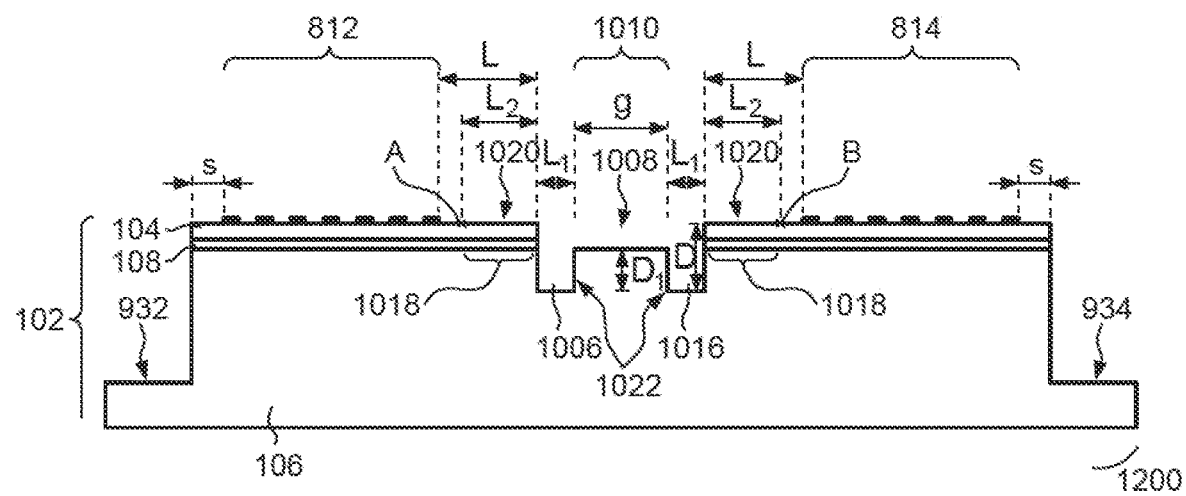

The substrate shown in FIGS. 8a and 8b is the same as the substrate 102 of FIGS. 5a, 5b, 6 and 7. The same reference numbers as in FIG. 7 will be used to refer to the same features and will not be explained again in details.

In FIG. 8a, the coupled cavity filter structure 1100 comprises like the coupled cavity filter structure 1000, two transducer structures 812, 814 with two grooves 932, 934 each positioned next to one transducer structure. The difference with the coupled cavity filter structure 900 is that a plurality of reflecting structures, namely two reflecting structures 1006 and 1016 are present in between the transducer structures 812, 814. Each reflecting structure 1006, 1016 of the plurality of reflecting structures corresponds to a groove 1022 and are defined by the width $L_1$ and the total depth D of the groove 1022.

These reflecting structures 1006, 1016 are separated from each other by a gap g in the direction of propagation X. The region 1008 located in between the two adjacent reflecting structures 1006, 1016, with its width defined by the gap g, corresponds to an acoustic cavity 1010. The acoustic cavity 1010 may be considered as a central cavity, while the acoustic cavities 1020 may be called the side cavities.

Like for the coupled cavity filter structure 800 and 900, the regions 1018 located between a reflecting structure 1006, 1016 and an adjacent transducer structure 812, 814 corresponds also to an acoustic cavity 1020, with a width defined by the distance $L_2$ between the edge of the reflecting structure 1006, 1016 and the point A, B located on the piezoelectric material layer 104 surface.

The region 1008 actually comprises the piezoelectric material layer 104 and the $SiO_2$ layer 108 on top of the base substrate 106.

Thus, in the coupled cavity surface acoustic wave filter structure 1100, three cavities are present in the direction of propagation of the acoustic wave, being separated by a reflecting structure, or said otherwise, a cavity is surrounded by two reflecting structures in between the transducer.

In another variant of the sixth embodiment, the coupled cavity surface acoustic wave filter structure 1200, as shown in FIG. 8b, has a region 1008 between the grooves 1006 and 1016, which is devoid the piezoelectric material layer 104 and devoid the $SiO_2$ layer 108. In the region 1008 only the base substrate 106 is present. According to a further variant, the surface of the base substrate could also be etched so that the thickness of the base substrate in the region 1008 would be smaller than in the regions 1018.

For all the FIGS. 8c to 8h, illustrating further variants with sub-cavities, the coupled cavity filter structure 1300 to 1800 are shown in a 2D plan view from the top.

Figure 8C:
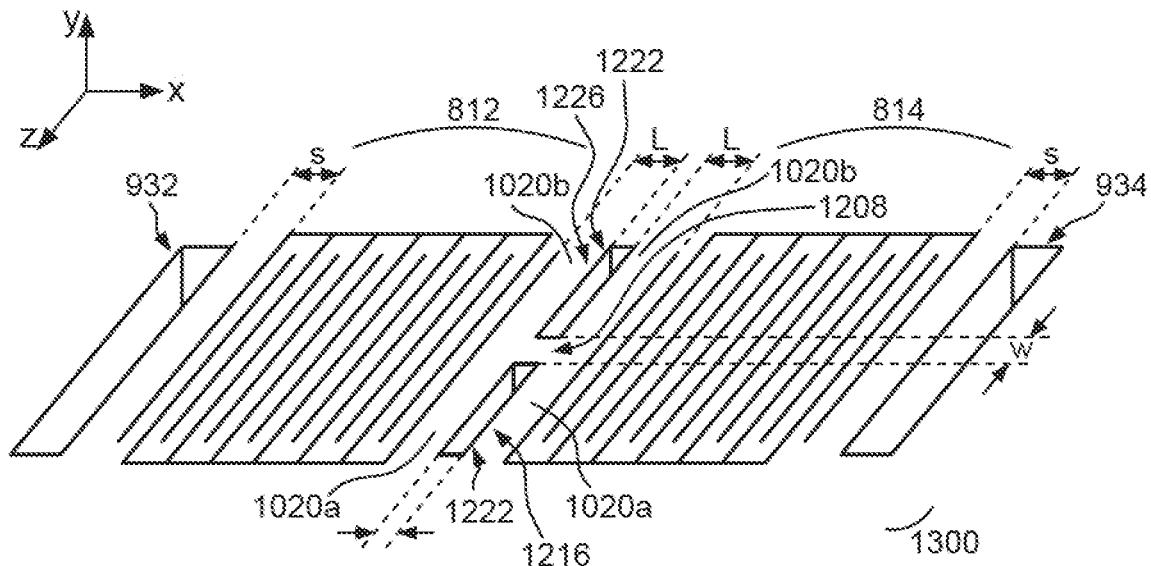
Figure 8D:
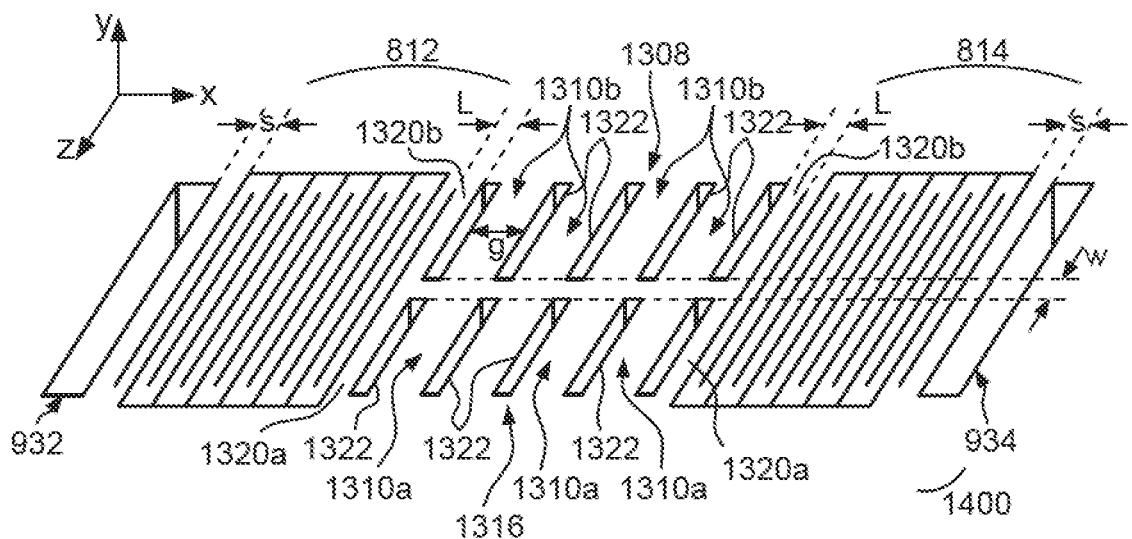

In the coupled cavity filter structure 1300 as shown in FIG. 8c, the two reflecting structures 1226, 1216 of the plurality of reflecting structures are separated from each other by a gap w but in the direction of propagation Z. The region 1208, like the region 1008 of FIG. 8a may or may not be etched. In this case, the acoustic cavities 1020 are split into two sub-cavities 1020a, 1020b.

In the coupled cavity filter structure 1400, like in the coupled cavity filter structure 1100, a plurality of reflecting structures 1316 are separated from each other by a gap g in the direction of propagation X, and like for the cavity filter structure 1200, the plurality of reflecting structures 1316 are also separated from each other by a gap w but in the direction of propagation Z. The regions 1308 in between the plurality of reflective structures, like the region 1008 of FIG. 8a and the regions 1208 of FIG. 8c may or may not be etched.

In this variant, the acoustic cavities 1310, 1320 are split into a plurality of sub-cavities 1310a, 1310b, 1320a, 1320b, like the coupled cavity filter structure 600 according to the second embodiment of the disclosure.

Figure 8E:
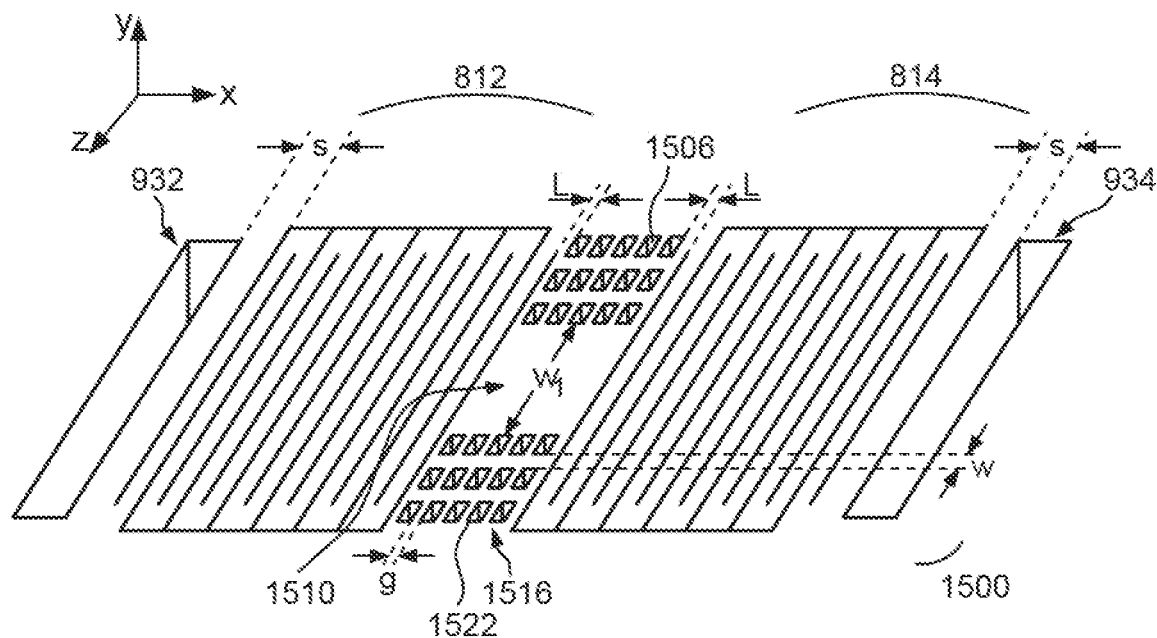

In the coupled cavity filter structure 1500, as shown in FIG. 8e, the plurality of reflecting structures 1506, 1516 are symmetrically separated by a central region 1510 with a width $w_1$ in the direction Z, along the whole distance between the two transducer structures 812, 814, where no reflecting structures 1506, 1516 are present. Furthermore, instead of being elongated etched grooves in the Z direction as in the previous variants, the grooves 1522 are now in a square form. For clarity purposes, only one reflecting structure 1506, 1516 and one groove 1522 are noted on the FIG. 8e.

Figure 8F:
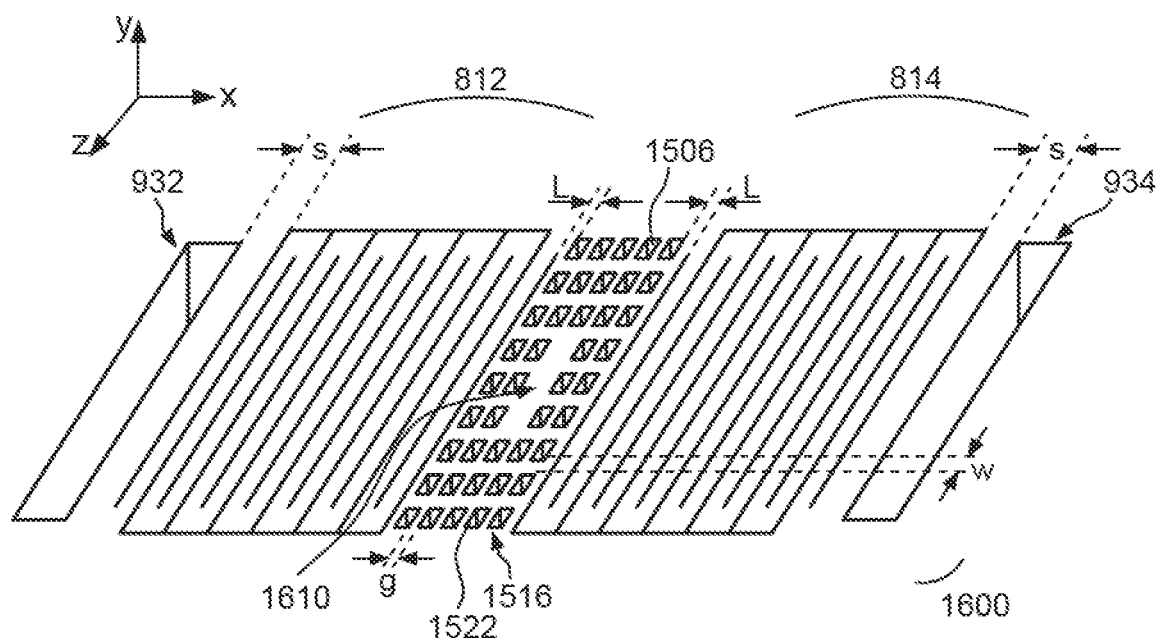

In the coupled cavity filter structure 1600, shown in FIG. 8f, the dimension of the region 1610 without reflecting structures 1506, 1516 between the transducer structures 812, 814 is different than central region 1510 of the FIG. 8e. The region 1610 is actually thinner, with three reflecting structures being removed in a row in the Z direction. The region 1610 could be assimilated to a break in symmetry of the plurality of reflective structures. For clarity purposes, only one reflecting structure 1506, 1516 and one groove 1522 are noted on the FIG. 8f.

Figure 8G:
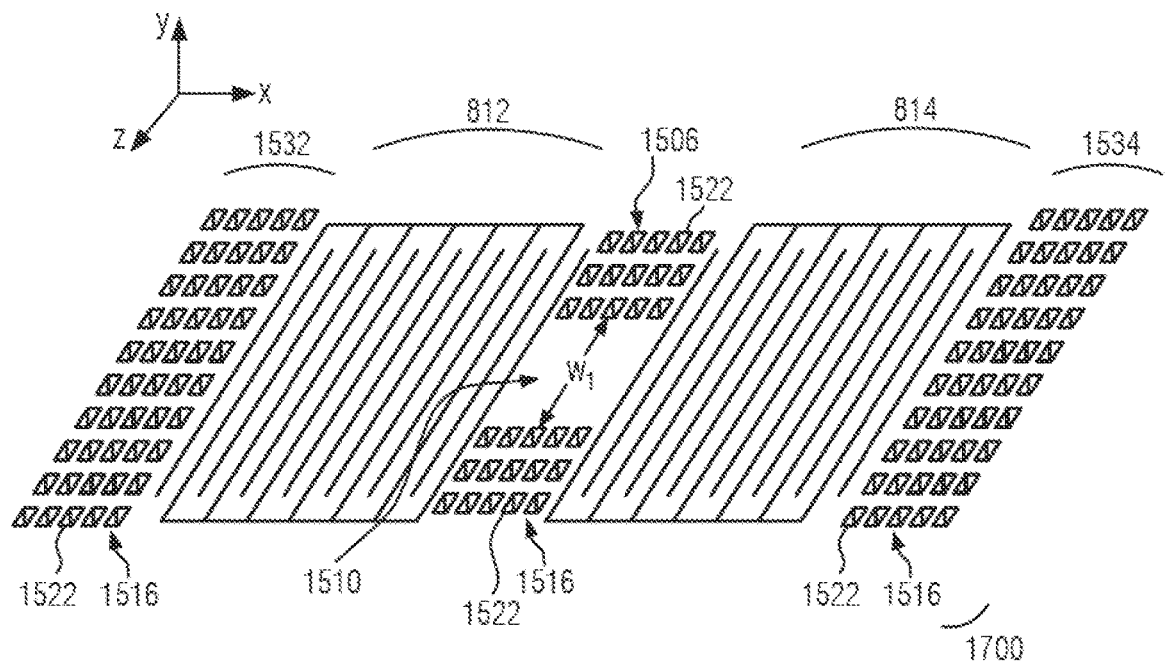

In another variant, the coupled cavity filter structure 1700 shown in FIG. 8g corresponds to the coupled cavity filter structure 1500 of FIG. 8e with the two additional grooves 1532, 1534 comprising a plurality of reflecting structures 1506, 1516 and thus a plurality of grooves 1522.

Figure 8H:
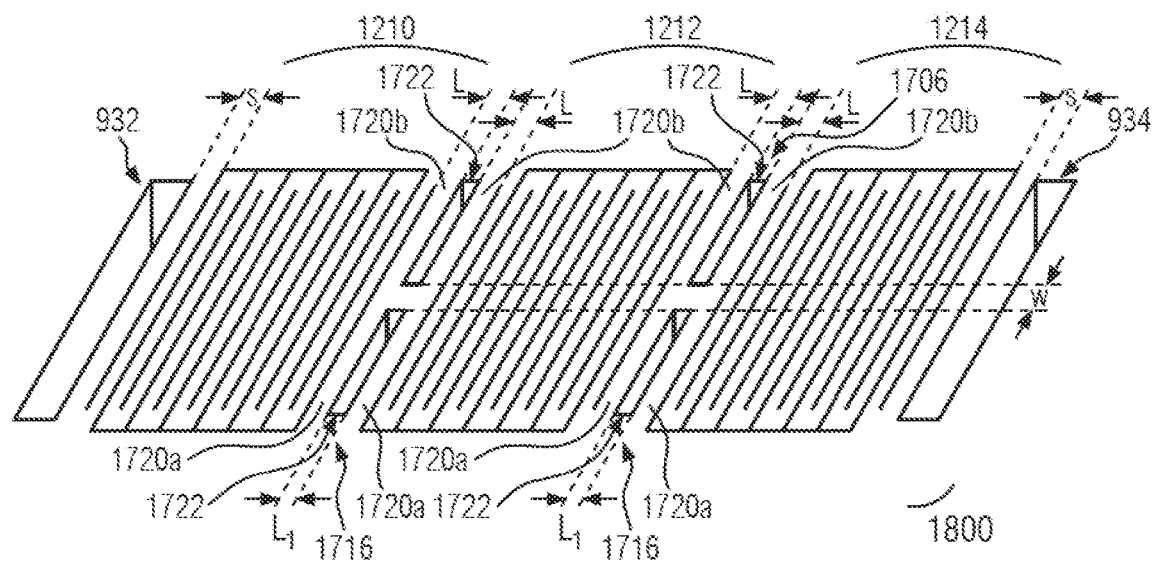

In a variant of the disclosure, the coupled cavity filter structure 1800 may comprise three transducer structures or even more. In FIG. 8h is shown the variant where three transducers structures 1210, 1212, 1214 are present in the coupled cavity surface acoustic wave filter structure 1200.

Two of the transducer structures 1210, 1214 are positioned, like in the structure of FIG. 2c, on the outside of the reflecting structures 1706, 1716 while the third transducer structure 1212 is positioned in the middle of the reflecting structures 1706, 1716, so that on each side of the third transducer structure 1212, one reflecting structure 1706, 1716, thus, a groove 1722, is present. The transducer structure 1212 is also separated from the two adjacent reflecting structures 1706, 1716 by a distance L, corresponding to the same distance between the transducer structure 1210, 1214 and their respective neighboring reflecting structure, here 1706 for the transducer structure 1210 and 1716 for the transducer structure 1214. Such a coupled cavity filter structure 1800 is symmetrical and results in a stronger confinement of energy in the cavities 1720a, 1720b compared to the cavity filter structure 1300 as shown in FIG. 8c, with only two transducer structures 812, 814. Furthermore, here, the reflecting structures 1706, 1716 are also separated from each other by a distance $w_1$, like in the device 1300 shown in FIG. 8c.

In a variant of the disclosure, the third transducer 1210 is not positioned in the middle of the coupled cavity filter structure so that the coupled cavity filter structure is not symmetrical.

Figure 9:
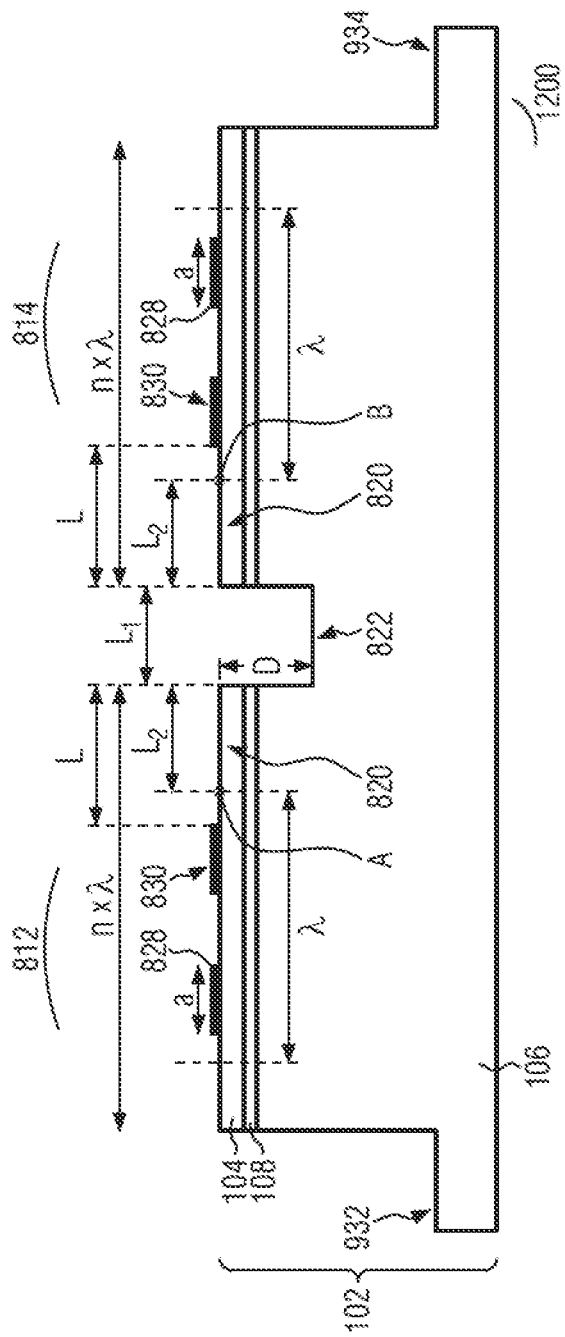
FIG. 9 shows the device according to the third embodiment of the disclosure used for a practical example of a simulation.

FIG. 9 shows the device according to the third embodiment of the disclosure, used for the simulation.

For this simulation, the device used corresponds to the device 1000 as shown in FIG. 7, but here the transducer structures 812 and 814 comprises only two electrodes fingers 828, 830 each.

Furthermore, the following parameters for the structure were used. A composite substrate with a $SiO_2$ layer of 200 nm in between a $LiTaO_3$ (Yx1)/42° piezoelectric layer of 500 nm and a semi-infinite (100) Silicon substrate was used for the simulation. The electrode pitch of the transducer p is equal to 800 nm yielding a wavelength λ, equal to 1.6 µm for a frequency operation near 2.5 GHz. The metallization ratio a/p is equal to 0.5, which means an electrode width of a equal to 400 nm. The electrode fingers are of Al—Cu with a thickness set to 100 nm.

Figure 10A:
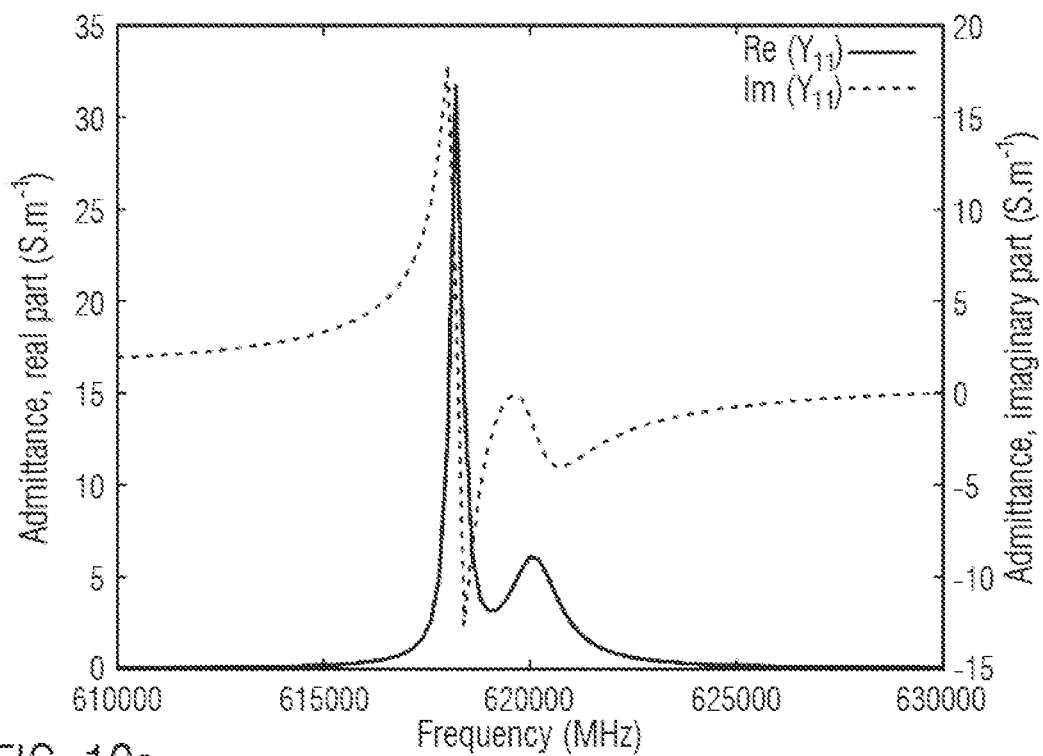
FIGS. 10a and 10b show the simulated characteristics of the coupled cavity surface acoustic wave filter structure as shown in FIG. 9, according to the third embodiment of the disclosure.
Figure 10B:
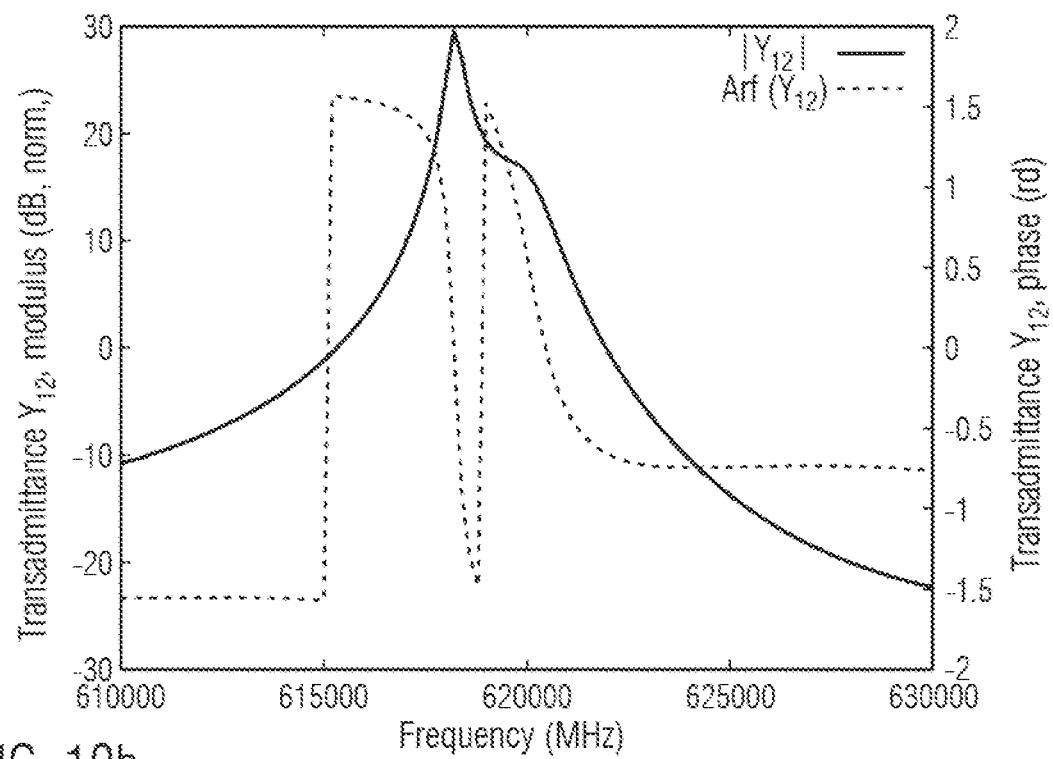

FIGS. 10a and 10b show the simulated characteristics of the coupled cavity surface acoustic wave filter structure as shown in FIG. 9, according to an example of the third embodiment of the disclosure.

In this practical example, the simulation was conducted with a mesh structure (not shown) with a pitch p equal to 2 µm, a depth $D_1$ equal to the pitch p, a depth $D_2$ equal to Exp, a width of the groove $L_1$ equal to 6.4 µm and a width $L_2$ equal to 2×p. A composite substrate with a 600 nm thick $LiTaO_3$, a 500 nm thick $SiO_2$ on a (100) Si base substrate was used.

FIG. 10a shows a graph of the admittance, real part on the left Y axis and imaginary part on the right Axis, as a function of frequency in GHz on the X axis. FIG. 10a shows two peaks around 61800 GHz and 62000 GHz, the peak at around 61750 GHz showing a strong admittance compared to the other peak around 62000 GHz.

FIG. 10b shows a graph of the trans-admittance, real part on the left Y axis and imaginary part on the right Axis, as a function of frequency in GHz on the X axis. FIG. 10b shows the same two peaks around 61800 GHz and 62000 GHz, but this time with a more balanced contribution, the two peaks being equivalent in amplitude.

The graphs illustrate the two coupled modes, with two balanced contributions allowing for an effective definition of a filter bandpass, whatever the actual amplitude level.

FIGS. 11a to 11d show the calculation of admittance of the filter elementary structure for various dimensions of the reflecting structure according to the disclosure.

A composite substrate with a $SiO_2$ layer of 500 nm in between a $LiTaO_3$ (Yx1)/42° piezoelectric layer of 600 nm and a semi-infinite (100) Silicon substrate was used for the simulation.

Figure 11A:
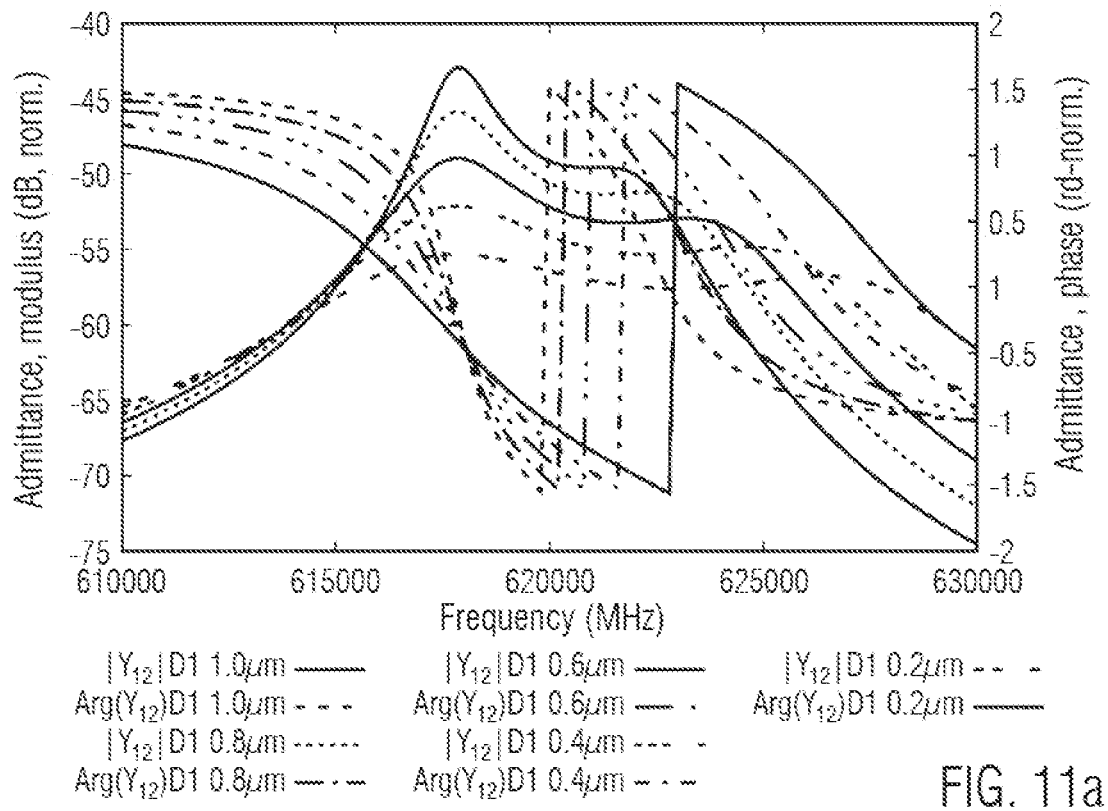
FIGS. 11a to 11d show the influence of parameters of the device on the simulated characteristics of a coupled cavity surface acoustic wave filter structure as shown in FIG. 9, according to the third embodiment of the disclosure.
Figure 11B:
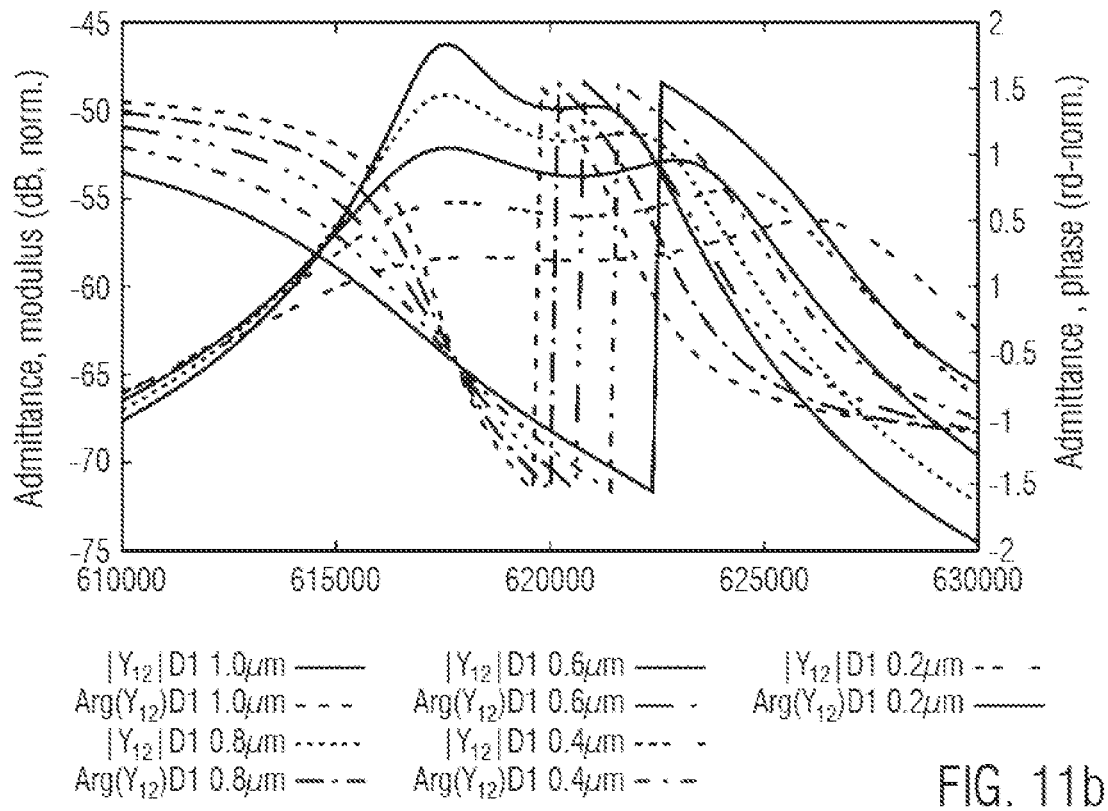

FIGS. 11a to 11b show a graph of the admittance, real part on the left Y axis and imaginary part on the right Axis, as a function of frequency in GHz on the X axis, for varying depth $D_1$ of the groove. The frequency range shown is between 61000 and 63000 GHz. All graphs show the same two peaks around 61800 GHz and 62500 GHz as in FIG. 10b, which could be considered as a double peak formation, with the first peak around 61800 GHz with higher admittance value than the second peak around 63000 GHz. In FIG. 10d, the double peak actually has a thinner bandwidth than in FIG. 11a, 11b or 10c.

Figure 11C:
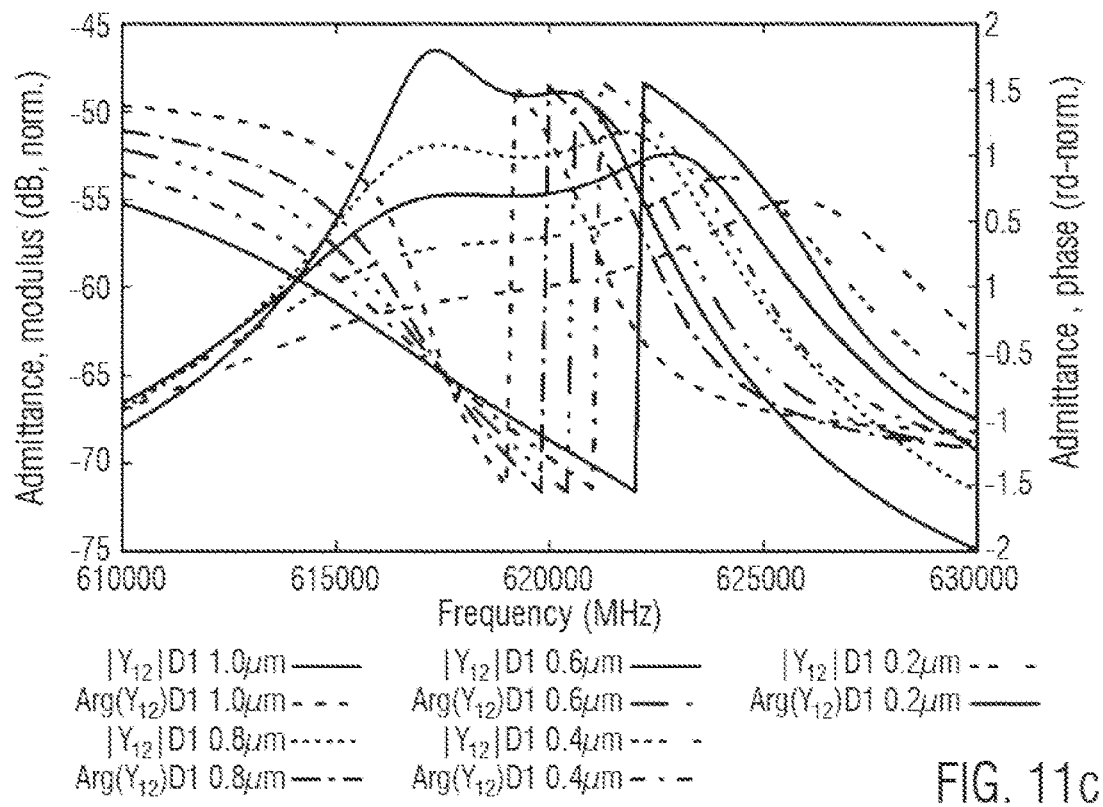
Figure 11D:
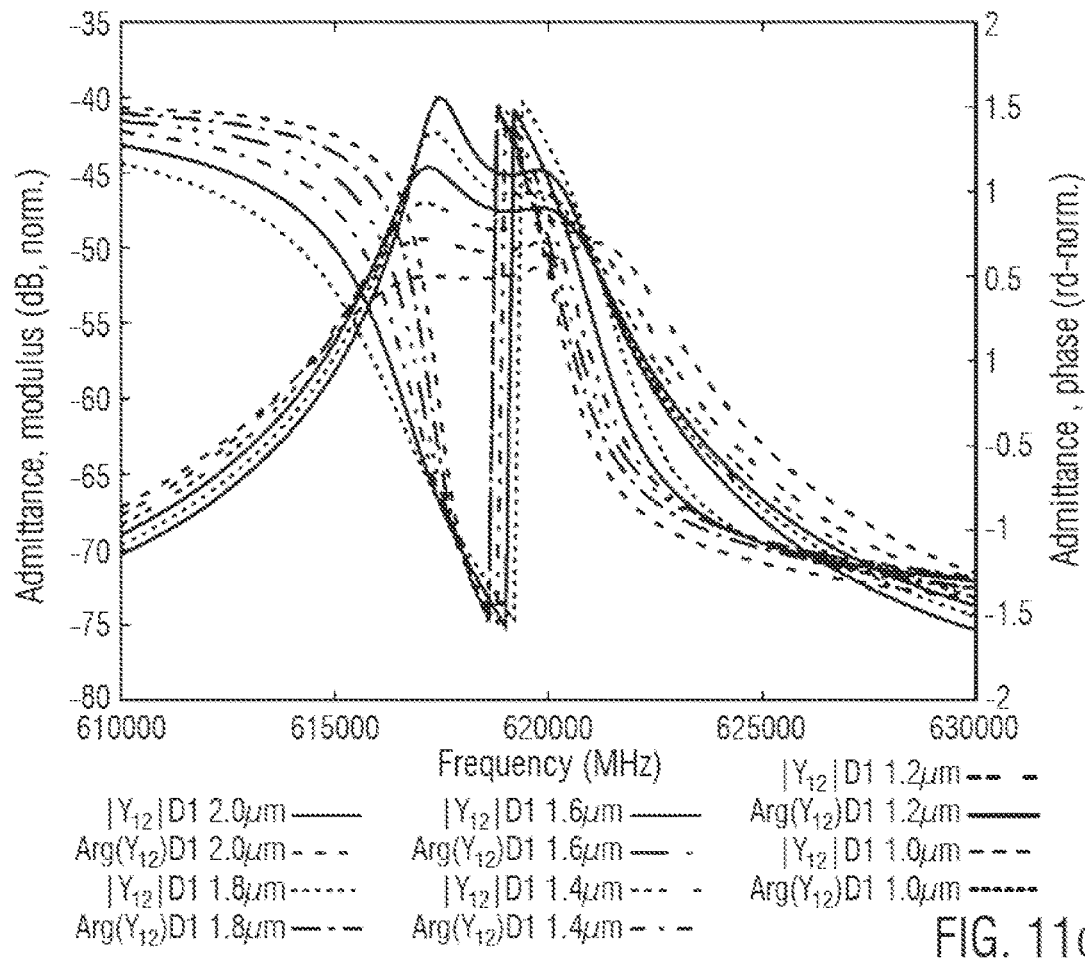

In FIGS. 11a to 11c, $D_1$ varies between 1 µm and 0.2 µm, while in FIG. 11d, $D_1$ varies between 1 µm and 2 µm.

In FIGS. 11a to 11d, the same behavior of the peaks may be seen. As $D_1$ decreases from 1 µm to 0.2 µm, the double peak formation moves towards higher frequency, while the first peak decreases in admittance and the second peak increases in admittance. In FIGS. 11b, 11c and 11d, the second peak increases in admittance so that it actually reaches higher values than the first peak, while in FIG. 11a, both peaks are equivalent for $D_1$ equal to 0.2 µm.

Figure 12A:
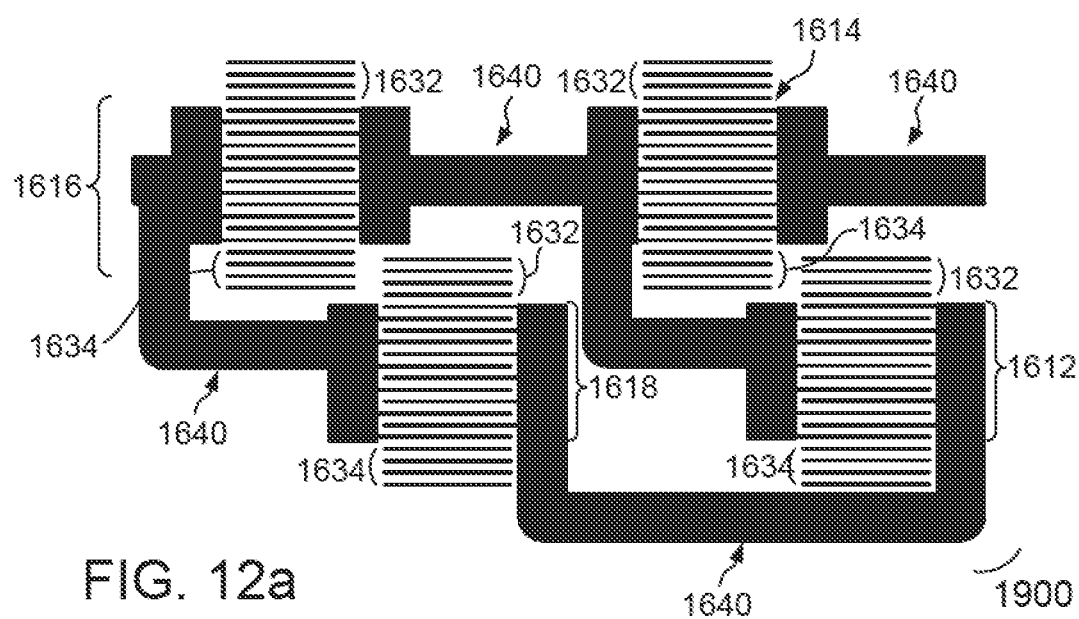
FIGS. 12a and 12b illustrate an example of a SAW ladder filter device according to the state of the art in FIG. 12a and according to the disclosure in FIG. 12b.
Figure 12B:
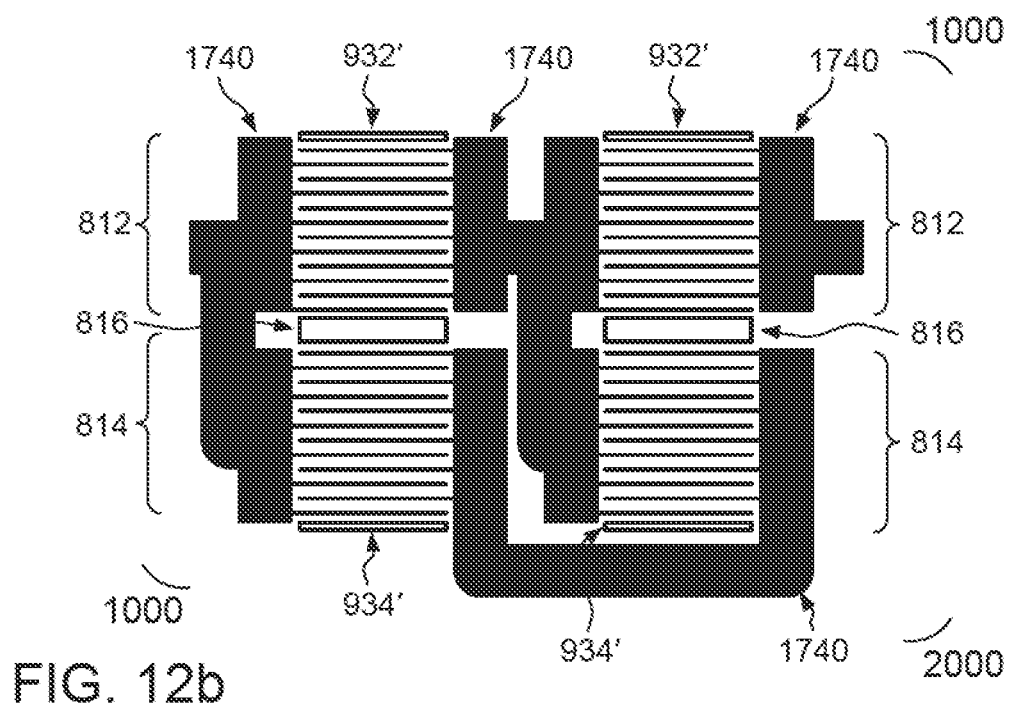

FIGS. 12a and 12b illustrate an example of a SAW ladder filter device according to the state of the art in FIG. 12a and according to the disclosure in FIG. 12b.

In FIG. 12a, four transducer structures 1612, 1614, 1616 and 1618 are each sandwiched between two reflecting structures 1632 and 1634. The inter-digitated electrodes of the transducers 1612, 1614, 1616, 1618 are connected to each other by metallic lines 1640. As can be seen, such design is bulky as the transducers and their metallic connections require a lot of space. The transducers cannot be aligned on a single line, either vertical or horizontal as they need to be shifted one to another to allow the connections between the transducers.

FIG. 12b shows a SAW ladder filter device 2000 where two coupled filter device 1000 according to the disclosure are positioned next to each other on a single line. Each cavity coupled filter device 1000 comprises two transducer structures 812, 814 respectively, with their respective reflecting structures 932, 934 and 816. The reflecting structure 816 is located in between two transducer structures, for example, 816 in between 812 and 814, and the reflecting structures 932 and 934 are positioned each on one side of a transducer structure, opposite to the side where the reflecting structure 816 is positioned. In FIG. 12b, the reflecting structures 816, 934 and 932 are represented as grooves, as in FIG. 8. Like in FIG. 12a, the electrodes of the transducers are connected to each other by metallic lines 1740.

The SAW ladder filter device 2000 is shown in FIG. 12b with two cavity coupled filter device 1000, but any variants of the cavity coupled filter device 1000 according to the disclosure may be used for the SAW ladder filter device.

The SAW ladder filter device 2000 according to the disclosure is more compact and does not require as much space as the SAW ladder filter device shown on FIG. 12a.

A number of embodiments of the disclosure have been described. Nevertheless, it is understood that various modifications and enhancements may be made without departing the following claims.

The invention claimed is:

1. A coupled cavity filter structure for a surface acoustic wave, comprising:
    an acoustic wave propagating substrate;

at least one input transducer structure and at least one output transducer structure disposed over the substrate, each comprising inter-digitated comb electrodes; and at least one reflecting structure comprising one or more metallic strips positioned at a distance d and in between the at least one input and output transducer structures in a direction of propagation of an acoustic wave, wherein the acoustic wave propagating substrate comprises a composite substrate including a base substrate and a piezoelectric layer.

2. The structure of claim 1, configured so that the surface acoustic wave is a shear wave or a longitudinal wave inside the piezoelectric layer.

3. The structure of claim 1, wherein the inter-digitated comb electrodes of the at least one input transducer structure and one output transducer structure are defined by the Bragg condition given by p=λ/2, λ being the operating acoustic wavelength of the at least one input and output transducer structures and p being the electrode pitch of the at least one input and output transducer structures.

4. The structure of claim 1, further comprising at least one Bragg mirror, located apart from the input and/or output transducer structure on the opposite side of the side where the at least one reflecting structure is located, in the direction of propagation of the acoustic wave.

5. The structure of claim 1, further comprising a plurality of reflecting structures separated from each other by a gap g and positioned at a distance d and in between the at least one input and output transducer structures, in the direction of propagation of an acoustic wave, each gap g between the plurality of reflecting structures and each gap d between a transducer structure and its neighboring reflecting structure forming an acoustic cavity.

6. The structure of claim 1, wherein a dimension of each acoustic cavity is smaller than λ/4.

7. The structure of claim 5, wherein the gap g between neighboring reflecting structures of the plurality of reflecting structures and/or the distance d between a reflecting structure and a neighboring transducer structure is the same or different.

8. The structure of claim 1, wherein the at least one reflecting structure or the plurality of reflecting structures has/have a reflection coefficient regarding a unitary metallic strip superior to coupling coefficient $k_s^2$ regarding the composite substrate and the inter-digitated comb electrodes of the transducer structure.

9. The structure of claim 1, wherein each reflecting structure comprises one or more metallic strips with a pitch of the metallic strips being the same or being different than the electrode pitch p of the transducer structure.

10. The structure of claim 9, wherein the metallic strips of each reflecting structure are electrically connected to each other.

11. The structure of claim 1, wherein the number of metallic strips of each reflecting structure is below 30, so that the reflection coefficient of the plurality of reflecting structures is above 0.5.

12. The structure of claim 1, wherein a difference between acoustic impedance of material of the piezoelectric layer and material of the metallic strips of the at least one reflecting structure is such that the reflection coefficient of the at least one reflecting structure is above 0.5.

13. A coupled cavity filter structure, using a surface acoustic wave, comprising:

an acoustic wave propagating substrate;

at least one input transducer structure and at least one output transducer structure provided over the substrate, each comprising electrodes; and at least one reflecting structure, the at least one reflecting structure comprising a groove positioned at a distance L and in between the at least one input and output transducer structures, in a direction of propagation of an acoustic wave; and wherein the acoustic wave propagating substrate comprises a composite substrate including a base substrate and a piezoelectric layer.

14. The structure of claim 13, configured so that the surface acoustic wave is a shear wave or a longitudinal wave inside the piezoelectric layer.

15. The structure of claim 13, wherein the electrodes of the at least one input transducer structure and at least one output transducer structure define an electrode pitch p being equal to nλ, λ being the operating acoustic wavelength of the at least one input and output transducer structures.

16. The structure of claim 13, further comprising at least one additional groove located apart from the input and/or output transducer structure on the opposite side of the side where the at least one reflecting structure is located, in the direction of propagation of the acoustic wave.

17. The structure of claim 16, wherein a depth of the at least one additional groove is on the order of λ or more.

18. The structure of claim 13, further comprising a plurality of reflecting structures, separated from each other by a gap g and positioned at a distance L and in between the at least one input and output transducer structures, in the direction of propagation of an acoustic wave, each gap g between the plurality of reflecting structures forming an acoustic cavity.

19. The structure of claim 13, wherein a distance between an edge of the groove and a position, in the direction of propagation of the acoustic wave, corresponding to an end of a pitch of the transducer structure on the side where the groove is located forms an acoustic cavity.

20. The structure of claim 16, wherein the distance between an edge of the groove and an edge of the at least one additional groove is on the order of nλ.

21. The structure of claim 13, wherein a relief angle θ between a horizontal axis and edge walls of the groove of the reflecting structure is 70° or more.

22. The structure of claim 13, wherein a depth of the groove of the reflecting structure structure is on the order of λ, or more, λ being the wavelength of the surface acoustic wave.

23. The structure of claim 16, wherein the at least one additional groove is configured to cause a reflection of a propagating wave along a propagation direction.

24. The structure of claim 18, wherein the acoustic cavity formed between at least two grooves of the plurality of reflecting structures is located at a surface of the substrate, being also the surface of the substrate where the at least one input and output transducer structures are located.

25. The structure of claim 18, wherein the acoustic cavity formed between at least two grooves of the plurality of reflecting structures is located at a depth between a surface of the substrate and a bottom surface of the at least two grooves.

26. The structure of claim 1, wherein the at least one input and output transducer structures are different.

27. The structure of claim 1, wherein the acoustic cavity can be split into sub-cavities separated from one another.

28. The structure of claim 1, comprising three or more transducer structures in the direction of propagation of the acoustic wave.

29. The structure of claim 1, wherein characteristics of the piezoelectric layer and of the electrodes of the at least one input and output transducer structures are chosen such that an electromechanical coupling coefficient of the acoustic wave in the piezoelectric layer is superior to 5%, in particular, superior to 7%.

30. The structure of claim 1, wherein a thickness of the piezoelectric layer is such that the electromechanical coupling coefficient of the shear acoustic wave in the piezoelectric layer is greater than 5%.

31. The structure of claim 1, further comprising a dielectric layer sandwiched between the base substrate and the piezoelectric layer.

32. The structure of claim 1, wherein the piezoelectric layer is Aluminum Nitride (ALN), Zinc Oxide (ZnO), PZT, Gallium Nitride (GaN), Lithium Tantalate $LiTaO_3$ or Lithium Niobate $LiNbO_3$ with a crystallographic orientation for Lithium Tantalate $LiTaO_3$ or Lithium Niobate $LiNbO_3$ defined as (YX/)/θ according to the standard IEEE 1949 Std-176, with θ, an angle of the crystallographic orientation being comprised between 0° and 60° or between 90° and 150°.

33. The structure of claim 1, wherein the base substrate of the composite substrate comprises a material selected from the group consisting of Silicon Carbon-Diamond, Sapphire, Quartz, and Silicon-Carbide.

34. The structure of claim 1, wherein the base substrate comprises a Bragg mirror underneath the piezoelectric layer.

35. The structure of claim 1, wherein the structure exhibits a filter bandpass between 0.5% and 10%.

36. The structure of claim 1, further comprising a passivation layer formed over the at least one input and output transducer structures and the at least one reflecting structure.

37. A SAW ladder filter device comprising at least two coupled cavity filter structures according to claim 1, wherein the at least two coupled cavity filter structures are positioned on a single line.

* * * * *

UNITED STATES PATENT AND TRADEMARK OFFICE
CERTIFICATE OF CORRECTION

PATENT NO. : 11,848,663 B2
APPLICATION NO. : 17/263880
DATED : December 19, 2023
INVENTOR(S) : Sylvain Ballandras and Thierry LaRoche It is certified that error appears in the above-identified patent and that said Letters Patent is hereby corrected as shown below:

In the Specification

| | | |
|---|---|---|
| Column 6, | Line 17, | change "Nitride (A1N), Zinc" to --Nitride (AlN), Zinc-- |
| Column 8, | Line 19, | change "wavelength A or" to --wavelength $\lambda$ or-- |
| Column 17, | Lines 10-11, | change "wavelength n$\Delta$, $\lambda$ being" to --wavelength $n\lambda$, $\lambda$ being-- |
| Column 18, | Line 11, | change "at a distances of" to --at a distance $s$ of-- |
| Column 18, | Lines 32-33, | change "at a distances of" to --at a distance $s$ of-- |
| Column 19, | Line 21, | change "multiple of A for" to --multiple of $\lambda$ for-- |
| Column 21, | Line 44, | change "equal to Exp," to --equal to 6xp,-- |

In the Claims

| | | | |
|---|---|---|---|
| Claim 22, | Column 24, | Line 49, | change "reflecting structure structure is on" to --reflecting structure is on-- |
| Claim 30, | Column 25, | Line 12, | change "of the shear acoustic" to --of the acoustic-- |
| Claim 32, | Column 25, | Line 18, | change "Nitride (ALN), Zinc" to --Nitride (AlN), Zinc-- |

Signed and Sealed this
Twentieth Day of February, 2024

*Katherine Kelly Vidal*

Katherine Kelly Vidal
*Director of the United States Patent and Trademark Office*